US012695822B2

(12) United States Patent
Lee et al.

(10) Patent No.: US 12,695,822 B2
(45) Date of Patent: Jul. 28, 2026

(54) DISPLAY APPARATUS

(71) Applicant: SAMSUNG DISPLAY CO., LTD.,
Yongin-si (KR)

(72) Inventors: Wonse Lee, Yongin-si (KR); Wonkyu Kwak, Yongin-si (KR)

(73) Assignee: SAMSUNG DISPLAY CO., LTD.,
Gyeonggi-Do (KR)

( * ) Notice: Subject to any disclaimer, the term of this patent is extended or adjusted under 35 U.S.C. 154(b) by 693 days.

(21) Appl. No.: 17/695,067

(22) Filed: Mar. 15, 2022

(65) Prior Publication Data

US 2022/0384547 A1        Dec. 1, 2022

(30) Foreign Application Priority Data

May 28, 2021    (KR) ........................ 10-2021-0069539

(51) Int. Cl.
H04M 1/02        (2006.01)
H10D 86/40        (2025.01)
(Continued)

(52) U.S. Cl.
CPC ........ H04M 1/0266 (2013.01); H10K 59/122 (2023.02); H10K 59/123 (2023.02); H10K 59/84 (2023.02); *H10D 86/441* (2025.01); *H10D 86/60* (2025.01); *H10K 59/1201* (2023.02); *H10K 59/1213* (2023.02); *H10K 59/124* (2023.02); *H10K 59/131* (2023.02); *H10K 59/30* (2023.02); *H10K 59/80516* (2023.02);
(Continued)

(58) Field of Classification Search
None
See application file for complete search history.

(56) References Cited

U.S. PATENT DOCUMENTS

2004/0119403 A1    6/2004   Mccormick et al.
2006/0061269 A1    3/2006   Tsuchiya et al.
(Continued)

FOREIGN PATENT DOCUMENTS

CN        1811865 A      8/2006
CN        110189639 A      8/2019
(Continued)

OTHER PUBLICATIONS

The Extended European Search Report for Application No. 22175945. 9-1212/4095926 dated Feb. 15, 2023.
(Continued)

*Primary Examiner* — Jessica S Manno
*Assistant Examiner* — Christopher A. Schodde
(74) *Attorney, Agent, or Firm* — CANTOR COLBURN LLP

(57) ABSTRACT

A display apparatus includes: a substrate including a first area and a second area; and a display element layer including a first display element and a second display element. The first display element includes a first electrode having a first thickness and is located in the first area, and the second display element includes a second electrode having a second thickness, which is less than the first thickness, and is located in the second area. The second display element is provided in plural, and one of the plurality of second display elements and another one of the plurality of second display elements are electrically connected to each other.

18 Claims, 22 Drawing Sheets

(51) Int. Cl.

| | | |
|---|---|---|
| *H10D 86/60* | (2025.01) | |
| *H10K 59/12* | (2023.01) | |
| *H10K 59/121* | (2023.01) | |
| *H10K 59/122* | (2023.01) | |
| *H10K 59/123* | (2023.01) | |
| *H10K 59/124* | (2023.01) | |
| *H10K 59/131* | (2023.01) | |
| *H10K 59/30* | (2023.01) | |
| *H10K 59/80* | (2023.01) | |
| *H10K 59/84* | (2023.01) | |
| *H10K 59/86* | (2023.01) | |
| *H10K 102/10* | (2023.01) | |

(52) U.S. Cl.
CPC ....... *H10K 59/80518* (2023.02); *H10K 59/86* (2023.02); *H10K 59/8792* (2023.02); *H10K 2102/103* (2023.02)

(56) References Cited

U.S. PATENT DOCUMENTS

| | | | |
|---|---|---|---|
| 2012/0074435 | A1 | 3/2012 | Ha et al. |
| 2012/0211775 | A1 | 8/2012 | Hosoya et al. |
| 2014/0167604 | A1 | 6/2014 | Iwata |
| 2014/0346444 | A1 | 11/2014 | Chung et al. |
| 2015/0015737 | A1 | 1/2015 | Hamada |
| 2016/0240801 | A1 | 8/2016 | Chang et al. |
| 2018/0183008 | A1 | 6/2018 | Song et al. |
| 2019/0147802 | A1 | 5/2019 | Li et al. |
| 2019/0312095 | A1* | 10/2019 | Park ..................... H10K 50/844 |
| 2020/0258967 | A1 | 8/2020 | Kim et al. |
| 2021/0091147 | A1* | 3/2021 | Liu ........................ H10K 59/50 |
| 2021/0091157 | A1 | 3/2021 | Oh et al. |
| 2021/0193758 | A1* | 6/2021 | Choi .................... H10K 59/123 |
| 2021/0208633 | A1 | 7/2021 | Ma et al. |
| 2021/0327958 | A1 | 10/2021 | Li et al. |
| 2022/0036795 | A1* | 2/2022 | Lou ..................... H10K 59/123 |
| 2022/0359626 | A1* | 11/2022 | Guo .................... H10K 50/865 |
| 2023/0209164 | A1* | 6/2023 | Ye ....................... H04M 1/0264 |
| | | | 348/374 |

FOREIGN PATENT DOCUMENTS

| | | | |
|---|---|---|---|
| CN | 111028765 | A | 4/2020 |
| CN | 111653201 | A | 9/2020 |
| CN | 111725287 | A | 9/2020 |
| EP | 3783660 | A1 | 2/2021 |
| KR | 20080007002 | A | 1/2008 |
| KR | 101786953 | B1 | 10/2017 |
| KR | 1020200097371 | A | 8/2020 |
| KR | 1020200102580 | A | 9/2020 |
| WO | 2020220588 | A1 | 11/2020 |

OTHER PUBLICATIONS

The Partial European Search Report for Application No. 22175945.9-1212; Date of Search Completion: Oct. 11, 2022; 18 pages.
European Office Action mailed Sep. 18, 2025 in EP Patent Application No. 22175945.9, 6 pages.

* cited by examiner

DISPLAY APPARATUS

This application claims priority to Korean Patent Application No. 10-2021-0069539, filed on May 28, 2021, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

Recently, a display apparatus has been used for various purposes. Also, as thicknesses and weights of the display apparatus has decreased, the range of applications of the display apparatus has increased.

As an area where an image is displayed in the display apparatus has increased, various functions linked to or associated with the display apparatus have been added. In order to add various functions, research on the display apparatus having an area for displaying an image while performing various functions is being conducted.

SUMMARY

An area for displaying an image and performing various functions needs to maintain a high transmittance of light or sound in order to perform the functions. However, when a high transmittance is maintained in the area for displaying an image and performing various functions, a resolution may be reduced.

One or more embodiments include a display apparatus capable of maintaining a high transmittance while maintaining a high resolution.

Additional aspects will be set forth in part in the description which follows and, in part, will be apparent from the description, or may be learned by practice of the presented embodiments.

According to one or more embodiments, a display apparatus includes: a substrate including a first area and a second area; and a display element layer including a first display element and a second display element, where the first display element includes a first electrode having a first thickness and is located in the first area, and the second display element includes a second electrode having a second thickness, which is less than the first thickness, and is located in the second area. The second display element is provided in plural, and one of the plurality of second display elements and another one of the plurality of second display elements are electrically connected to each other.

The first electrode may include a first layer including at least one of indium (In), tin (Sn), and oxygen (O), and a second layer including silver (Ag), and the second electrode may include at least one of indium (In), tin (Sn), and oxygen (O).

The display element layer may further include a pixel-defining film covering an edge of the first electrode and defining a first electrode opening portion overlapping the first electrode and a second area opening portion overlapping the second area in a plan view.

The pixel-defining film may include a light-blocking material.

The first display element may include a first emission layer overlapping the first electrode opening portion in the plan view, and the second display element may include a second emission layer located on the second electrode and covering a side surface of the second electrode.

The display apparatus may further include a wiring located between the substrate and the display element layer, where the wiring may be configured to electrically connect one of the plurality of second display elements to another one of the plurality of second display elements.

The substrate may further include a third area adjacent to the second area, where the display apparatus further includes: a first pixel circuit electrically connected to the first display element and located in the first area; a second pixel circuit electrically connected to the second display element and located in the third area; and a connection wiring extending from the third area to the second area and which electrically connects the second display element to the second pixel circuit.

The display apparatus may further include an organic insulating layer located between the substrate and the display element layer, wherein the connection wiring includes at least one of a first connection wiring located between the substrate and the organic insulating layer and a second connection wiring located between the organic insulating layer and the display element layer.

The display element layer may further include a third display element located in the third area and including a third electrode having a third thickness, where the third display element may be provided in plural, and the third electrode of one of the plurality of third display elements and the third electrode of another one of the plurality of third display elements may be integrally provided with each other.

The display apparatus may further include a component overlapping the second area in the plan view.

According to one or more embodiments, a display apparatus includes: a substrate which includes a first area and a second area; and a display element layer including a first display element, a second display element and a pixel-defining film, where the first display element includes a first electrode and is located in the first area, the second display element includes a second electrode and is located in the second area, and the pixel-defining film covers an edge of the first electrode and defines a first electrode opening portion overlapping the first electrode and a second area opening portion overlapping the second area in the plan view.

The first electrode may have a first thickness, and the second electrode may have a second thickness which is less than the first thickness.

The first electrode may include a first layer including at least one of indium (In), tin (Sn), and oxygen (O) and a second layer including silver (Ag), and the second electrode may include at least one of indium (In), tin (Sn), and oxygen (O).

The pixel-defining film may include a light-blocking material.

The first display element may include a first emission layer overlapping the first electrode opening portion in the plan view, and the second display element may include a second emission layer located on the second electrode and covering a side surface of the second electrode.

The display apparatus may further include a wiring located between the substrate and the display element layer, where the second display element may be provided in plural, and the wiring may be configured to electrically connect one of the plurality of second display elements to another one of the plurality of second display elements.

The substrate may further include a third area adjacent to the second area, where the display apparatus may further include: a first pixel circuit electrically connected to the first display element and located in the first area; a second pixel circuit electrically connected to the second display element and located in the third area; and a connection wiring extending from the third area to the second area and which electrically connects the second display element to the second pixel circuit.

The display apparatus may further include an organic insulating layer located between the substrate and the display element layer, where the connection wiring may include at least one of a first connection wiring located between the substrate and the organic insulating layer and a second connection wiring located between the organic insulating layer and the display element layer.

The display element layer may further include a third display element including a third electrode located in the third area and having a third thickness, where the third display element may be provided in plural, and the third electrode of one of the plurality of third display elements and the third electrode of another one of the plurality of third display elements are integrally provided with each other.

The display apparatus may further include a component overlapping the second area in the plan view.

BRIEF DESCRIPTION OF THE DRAWINGS

The above and other aspects, features, and advantages of certain embodiments will be more apparent from the following description taken in conjunction with the accompanying drawings, in which:

FIGS. 2A and 2B are cross-sectional views taken along line A-A' of the display apparatus of FIG. 1, according to various embodiments;

FIG. 5 is a cross-sectional view taken along line B-B' of the display panel of FIG. 4;

FIGS. 6A and 6B are cross-sectional views taken along line C-C' of the display panel of FIG. 4, according to various embodiments;

FIG. 8 is a cross-sectional view taken along lines E-E' and F-F' of the display panel of FIG. 7;

FIG. 10 is a plan view illustrating a part of a third area of a display panel, according to an embodiment;

FIG. 11 is a cross-sectional view taken along line H-H' of the display panel of FIG. 10; and FIGS. 12A through 12I are cross-sectional views illustrating a method of manufacturing a display apparatus, according to an embodiment.

DETAILED DESCRIPTION

Figure 1:
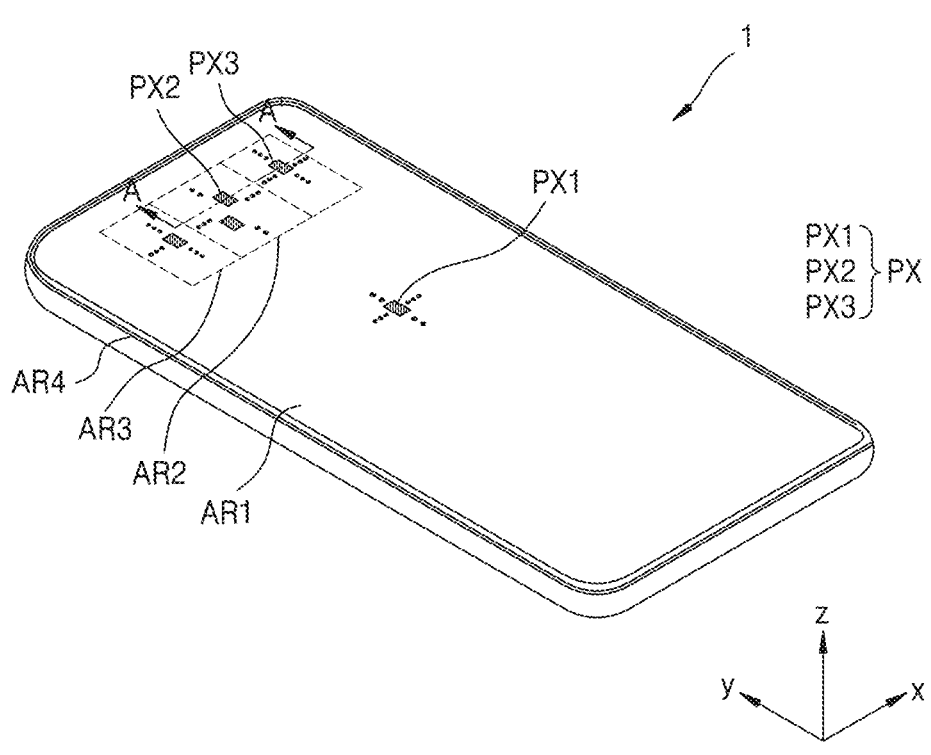
FIG. 1 is a perspective view illustrating a display apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Reference will now be made in detail to embodiments, examples of which are illustrated in the accompanying drawings, and in the drawings, the same elements are denoted by the same reference numerals, and thus a repeated description thereof will be omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" or "comprising" used herein specify the presence of stated features or components, but do not preclude the presence or addition of one or more other features or components.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or contracted for convenience of explanation. For example, because sizes and thicknesses of elements in the drawings are arbitrarily illustrated for convenience of explanation, the disclosure is not limited thereto.

When a certain embodiment may be implemented differently, a specific process order may be different from the described order. For example, two consecutively described processes may be performed substantially at the same time or may be performed in an order opposite to the described order.

It will be understood that when a layer, region, or component is referred to as being "connected," the layer, the region, or the component may be directly connected or may be indirectly connected with intervening layers, regions, or components therebetween. For example, when layers, regions, or components are referred to as being "electrically connected," the layers, the regions, or the components may be directly electrically connected, or may be indirectly electrically connected with intervening layers, regions, or components therebetween.

FIG. 1 is a perspective view illustrating a display apparatus 1, according to an embodiment.

Referring to FIG. 1, the display apparatus 1 may display an image. The display apparatus 1 may include pixels PX.

Each of the pixels PX may be defined as an area where a display element emits light. In an embodiment, each pixel PX may include a plurality of sub-pixels. In an embodiment, the plurality of sub-pixels may include a first sub-pixel, a second sub-pixel, and a third sub-pixel. The first sub-pixel, the second sub-pixel, and the third sub-pixel may emit light of different wavelength bands.

A plurality of pixels PX may be provided in the display apparatus 1. The plurality of pixels PX may each emit light, and may display an image. In an embodiment, the pixels PX may include a first pixel PX1, a second pixel PX2, and a third pixel PX3.

The display apparatus 1 may include a first area AR1, a second area AR2, a third area AR3, and a fourth area AR4. The pixel PX may be located in the first area AR1, the second area AR2, and the third area AR3. The first area AR1, the second area AR2, and the third area AR3 may be display areas. The pixel PX may not be located in the fourth area AR4, and the fourth area AR4 may be a non-display area.

The first area AR1 may surround at least part of the second area AR2 and the third area AR3. In another embodiment, the first area AR1 may surround the entirety of the second area AR2 and the third area AR3. In another embodiment, the first area AR1 may surround only a part of the second area AR2 and the third area AR3. The first pixel PX1 may be located in the first area AR1. In an embodiment, a resolution of the display apparatus 1 in the first area AR1 may be equal to or higher than a resolution of the display apparatus 1 in the second area AR2.

At least one of the second area AR2 and the third area AR3 may be an area that overlaps a component in a plan view (e.g., on an xy plane) and where the pixel PX is located. For example, the second area AR2 may be an area that overlaps the component and where the pixel PX is located. Alternatively, both the second area AR2 and the third area AR3 may be areas that overlap the component and where the pixel PX is located. In an embodiment, the second pixel PX2 may be located in the second area AR2. The third pixel PX3 may be located in the third area AR3. Accordingly, the second area AR2 and the third area AR3 may be areas where an image is displayed and the component is located.

Because at least one of the second area AR2 and the third area AR3 may overlap the component in the plan view, the display apparatus 1 should have a high transmittance of light or sound in the second area AR2 and the third area AR3. For example, a transmittance of the display apparatus 1 in at least one of the second area AR2 and the second area AR3 may be equal to or greater than about 10 percentages (%), and more preferably, equal to or greater than 25%, equal to or greater than 40%, equal to or greater than 50%, equal to or greater than 85%, or equal to or greater than 90%. In an embodiment, a transmittance of the display apparatus 1 in the second area AR2 may be equal to or higher than a transmittance of the display apparatus 1 in the third area AR3.

At least one second area AR2 may be provided in the display apparatus 1. For example, the display apparatus 1 may include one second area AR2, or a plurality of second areas AR2.

The third area AR3 may be adjacent to the second area AR2. The third area AR3 may be located on a side of the second area AR2. For example, the second area AR2 and the third area AR3 may be parallel to each other in a first direction (e.g., an x direction or a −x direction). Alternatively, the second area AR2 and the third area AR3 may be parallel to each other in a second direction (e.g., a y direction or a −y direction). In an embodiment, the third area AR3 may be located on opposite sides of the second area AR2. In some embodiments, the third area AR3 may be omitted.

Although the second area AR2 and the third area AR3 are located on an upper portion of the display apparatus 1 in FIG. 1, in another embodiment, the second area AR2 and the third area AR3 may be located on a lower portion, a right portion, or a left portion of the display apparatus 1.

In an embodiment, at least one of the second area AR2 and the third area AR3 may have any of various shapes such as a circular shape, a polygonal shape (e.g., a triangular shape or a quadrangular shape), a star shape, or a diamond shape in the plan view. In FIG. 1, each of the second area AR2 and the third area AR3 has a quadrangular shape.

The fourth area AR4 may surround at least part of the first area AR1. In another embodiment, the fourth area AR4 may surround the entirety of the first area AR1. In an embodiment, the fourth area AR4 may surround the entirety of the first area AR1, the second area AR2, and the third area AR3.

Figure 2A:
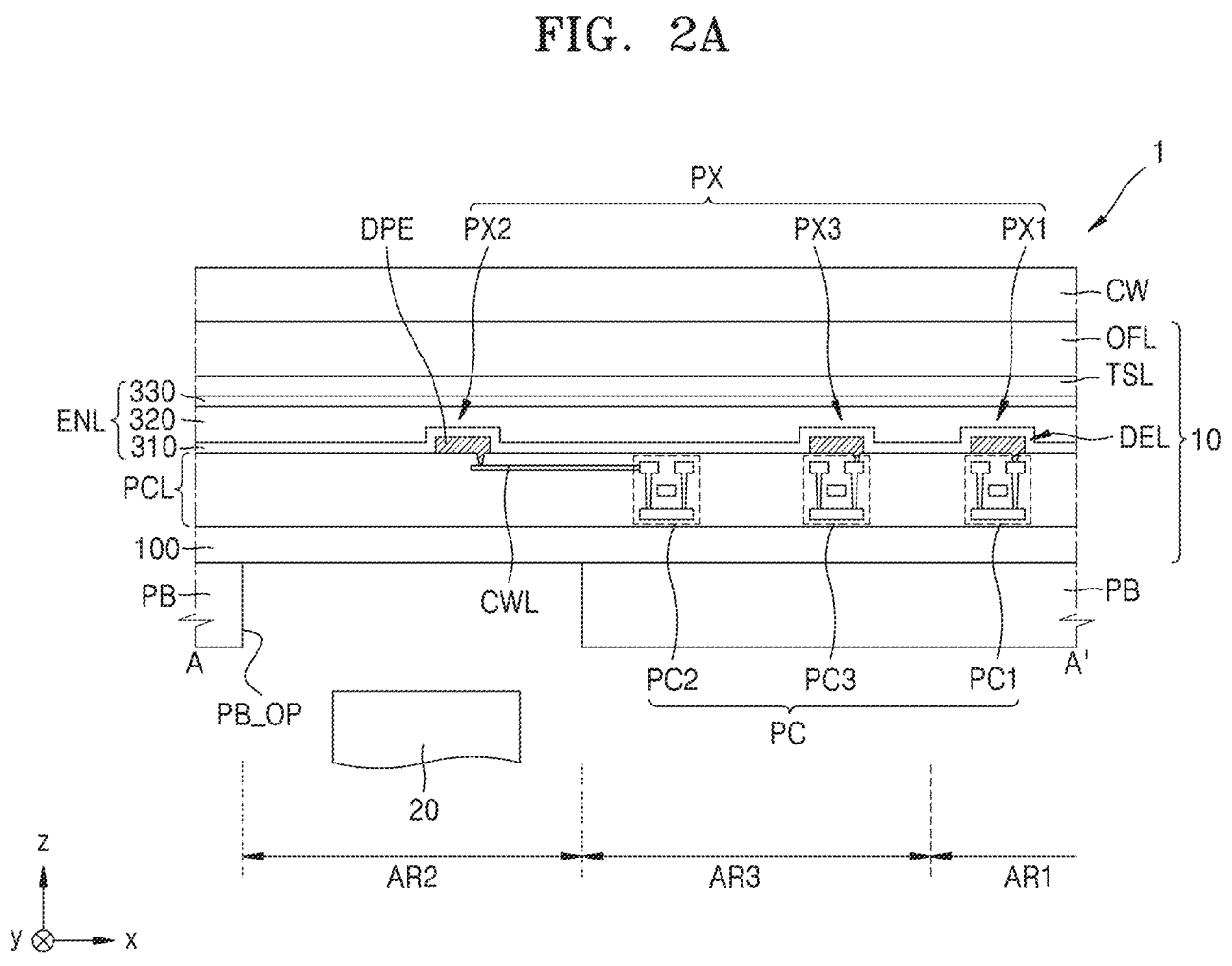
Figure 2B:
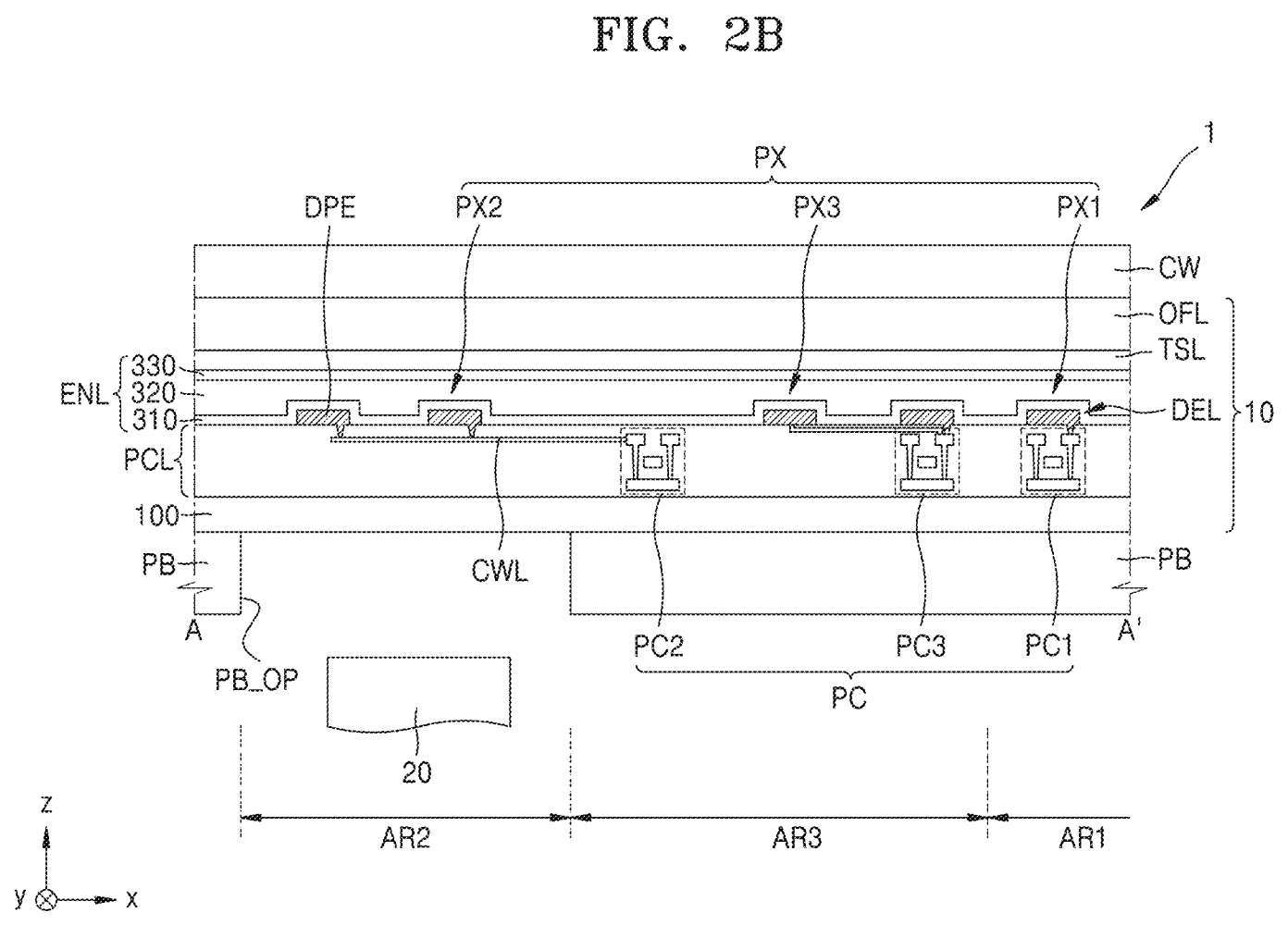

FIGS. 2A and 2B are cross-sectional views taken along line A-A' of the display apparatus 1 of FIG. 1, according to various embodiments.

Referring to FIGS. 2A and 2B, the display apparatus 1 may include a display panel 10, a panel protection member PB, a component 20, and a cover window CW. The display panel 10 may include a substrate 100, a pixel circuit layer PCL including a pixel circuit PC, a display element layer DEL including a display element DPE, an encapsulation layer ENL, a touch sensor layer TSL, and an optical functional layer OFL.

The display apparatus 1 may include the first area AR1, the second area AR2, and the third area AR3. In other words, the first area AR1, the second area AR2, and the third area AR3 may be defined in the substrate 100 (e.g., multi-layer films on the substrate 100). For example, the first area AR1, the second area AR2, and the third area AR3 may be defined in the substrate 100. That is, the substrate 100 may include the first area AR1, the second area AR2, and the third area AR3. The following will be described assuming that the substrate 100 includes the first area AR1, the second area AR2, and the third area AR3.

The substrate 100 may be formed of or include an insulating material such as glass, quartz, or a polymer resin. The substrate 100 may be a rigid substrate, or a flexible substrate that is bendable, foldable, or rollable.

The pixel circuit layer PCL may be located on the substrate 100. The pixel circuit layer PCL may include the pixel circuit PC, a connection wiring CWL, and an insulating layer. The pixel circuit PC may include a first pixel circuit PC1, a second pixel circuit PC2, and a third pixel circuit PC3. The first pixel circuit PC1 may be located in the first area AR1. Both the second pixel circuit PC2 and the third pixel circuit PC3 may be located in the second area AR2. The pixel circuit PC may not be located in the second area AR2. Accordingly, a transmittance (e.g., a light transmittance) of the display panel 10 in the second area AR2 may be higher than a transmittance of the display panel 10 in the first area AR1 and the third area AR3.

The connection wiring CWL may be electrically connected to the pixel circuit PC. In an embodiment, the connection wiring CWL may be electrically connected to the second pixel circuit PC2. The connection wiring CWL may extend from the third area AR3 to the second area AR2 and may overlap the second area AR2 and the third area AR3 in the plan view. In an embodiment, the connection wiring CWL may include a transparent conducting oxide. For example, the connection wiring CWL may include a conductive oxide such as indium tin oxide ("ITO"), indium zinc oxide ("IZO"), zinc oxide (ZnO), indium oxide (In$_2$O$_3$), indium gallium oxide ("IGO"), and/or aluminum zinc oxide ("AZO").

The display element layer DEL may include the display element DPE and may be located on the pixel circuit layer PCL. In an embodiment, the display element DPE may be an organic light-emitting diode including an organic emission layer. Alternatively, the display element DPE may be a light-emitting diode ("LED"). The light-emitting diode may have a micro-scale or nano-scale size. For example, the light-emitting diode may be a micro-light-emitting diode. Alternatively, the light-emitting diode may be a nanorod light-emitting diode. The nanorod light-emitting diode may include gallium nitride (GaN). In an embodiment, a color conversion layer may be located on the nanorod light-emitting diode. The color conversion layer may include quantum dots. Alternatively, the display element DPE may be a quantum dot light-emitting diode including a quantum dot emission layer. Alternatively, the display element DPE may be an inorganic light-emitting diode including an inorganic semiconductor. The following will be described in detail assuming that the display element DPE is an organic light-emitting diode.

The display panel 10 may include a plurality of display elements DPE. The plurality of display elements DPE may be located in the first area AR1, the second area AR2, and the third area AR3. In an embodiment, the display element DPE may emit light to implement the pixel PX. For example, the display element DPE located in the first area AR1 may emit light to implement the first pixel PX1. The display element DPE located in the second area AR2 may emit light to implement the second pixel PX2. The display element DPE located in the third area AR3 may emit light to implement the third pixel PX3. Accordingly, the display apparatus 1 may display an image in the first area AR1, the second area AR2, and the third area AR3.

The display element DPE may be connected to the pixel circuit PC. The display element DPE may be electrically connected to the pixel circuit PC. Referring to FIG. 2A, one pixel circuit PC may be electrically connected to one display element DPE. Referring to FIG. 2B, one pixel circuit PC may be electrically connected to a plurality of display elements DPE. In other words, one pixel circuit PC may be electrically connected to one of the plurality of display elements DPE and another one of the plurality of display elements DPE. For example, one second pixel circuit PC2 may be electrically connected to a plurality of display elements DPE located in the second area AR2. Alternatively, one third pixel circuit PC3 may be electrically connected to a plurality of display elements DPE located in the third area AR3. In this case, a plurality of display elements DPE may emit light by using a small number of pixel circuits PC, and the total number of pixel circuits PC may be reduced.

The first pixel circuit PC1 and the display element DPE located in the first area AR1 may be electrically connected to each other. The second pixel circuit PC2 located in the third area AR3 and the display element DPE located in the second area AR2 may be electrically connected to each other. In an embodiment, the second pixel circuit PC2 and the display element DPE located in the second area AR2 may be electrically connected to each other through the connection wiring CWL. The third pixel circuit PC3 located in the third area AR3 and the display element DPE located in the third area AR3 may be electrically connected to each other.

The encapsulation layer ENL may be located on the display element layer DEL. The encapsulation layer ENL may cover the display element DPE. In an embodiment, the encapsulation layer ENL may include at least one inorganic encapsulation layer and at least one organic encapsulation layer. The at least one inorganic encapsulation layer may include at least one inorganic material from among aluminum oxide (Al$_2$O$_3$), titanium oxide (TiO$_2$), tantalum oxide (Ta$_2$O$_5$), zinc oxide (ZnO), silicon oxide (SiO$_2$), silicon nitride (SiNx), and silicon oxynitride (SiON). The at least one organic encapsulation layer may include a polymer-based material. Examples of the polymer-based material may include an acrylic resin, an epoxy resin, polyimide, and polyethylene. In an embodiment, the at least one organic encapsulation layer may include acrylate.

In an embodiment, the encapsulation layer ENL may include a first inorganic encapsulation layer 310, an organic encapsulation layer 320, and a second inorganic encapsulation layer 330. The first inorganic encapsulation layer 310 and the second inorganic encapsulation layer 330 may prevent or reduce exposure of the organic encapsulation layer 320 and/or the display element DPE to a foreign material such as moisture.

In another embodiment, the encapsulation layer ENL may have a structure in which the substrate 100 and an upper substrate that is a transparent member are coupled to each other by a sealing member to seal an inner space between the substrate 100 and the upper substrate. In this case, a moisture absorbent or a filler may be located in the inner space. The sealing member may be a sealant, and in another embodiment, the sealing member may include a material that is cured by a laser. For example, the sealing member may be a frit. Specifically, the sealing member may include a urethane resin, an epoxy resin, or an acrylic resin that is an organic sealant, or silicone that is an inorganic sealant. Examples of the urethane resin may include urethane acrylate. Examples of the acrylic resin may include butyl acrylate and ethylhexyl acrylate. The sealing member may include a material that is cured by heat.

The touch sensor layer TSL may obtain coordinate information according to an external input, for example, a touch event. The touch sensor layer TSL may include a touch electrode and touch wirings connected to the touch electrode. The touch sensor layer TSL may detect an external input by using a self-capacitive method or a mutual capacitive method.

The touch sensor layer TSL may be located on the encapsulation layer ENL. In an embodiment, the touch sensor layer TSL may be located directly on the encapsulation layer ENL. In this case, an adhesive layer such as an optically clear adhesive may not be located between the touch sensor layer TSL and the encapsulation layer ENL. In another embodiment, the touch sensor layer TSL may be separately formed on a touch substrate, and then may be coupled to the encapsulation layer ENL through an adhesive layer such as an optically clear adhesive.

The optical functional layer OFL may include an anti-reflection layer. The anti-reflection layer may reduce a reflectance of light (e.g., external light) incident on the display apparatus 1. In some embodiments, the optical functional layer OFL may be a polarizing film. In some embodiments, the optical functional layer OFL may be provided as a filter plate including a black matrix and color filters.

The cover window CW may be located on the display panel 10. The cover window CW may protect the display panel 10. The cover window CW may include at least one of glass, sapphire, and plastic. The cover window CW may include, for example, ultra-thin glass ("UTG") or colorless polyimide ("CPI").

The panel protection member PB may be located under the substrate 100. The panel protection member PB may support and protect the substrate 100. In an embodiment, the panel protection member PB may define an opening PB_OP overlapping the second area AR2 in the plan view. In another embodiment, the opening PB_OP of the panel protection member PB may overlap the second area AR2 and the third area AR3 in the plan view. In an embodiment, the panel protection member PB may include polyethylene terephthalate or polyimide.

The component 20 may be located under the display panel 10. In an embodiment, the component 20 may be located opposite to the cover window CW with the display panel 10 therebetween. In an embodiment, the component 20 may overlap the second area AR2. In another embodiment, the component 20 may overlap the second area AR2 and the third area AR3 in the plan view.

The component 20 that is a camera using infrared light or visible light may include an image pickup device. Alternatively, the component 20 may be a solar cell, a flash, an illuminance sensor, a proximity sensor, or an iris sensor. Alternatively, the component 20 may have a function for receiving sound. In order to minimize the limitation of a function of the component 20, the second pixel circuit PC2 for driving the display element DPE located in the second area AR2 may not be located in the second area AR2 but may be located in the third area AR3. Accordingly, a transmittance of the display panel 10 in the second area AR2 may be higher than a transmittance of the display panel 10 in the third area AR3. Also, a transmittance of the display panel 10 in the second area AR2 may be higher than a transmittance of the display panel 10 in the first area AR1.

Figure 3:
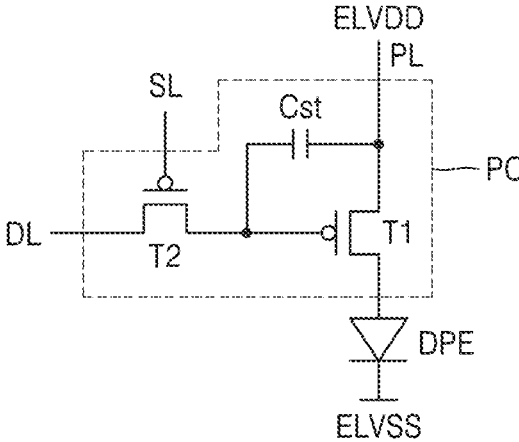
FIG. 3 is an equivalent circuit diagram illustrating a pixel circuit electrically connected to a display element, according to an embodiment.

FIG. 3 is an equivalent circuit diagram illustrating the pixel circuit PC electrically connected to the display element DPE, according to an embodiment.

Referring to FIG. 3, the pixel circuit PC may include a driving thin-film transistor T1, a switching thin-film transistor T2, and a storage capacitor Cst.

The switching thin-film transistor T2 may be electrically connected to a scan line SL and a data line DL, and may transmit a data signal or a data voltage input from the data line DL to the driving thin-film transistor T1 based on a scan signal or a switching voltage input from the scan line SL. The storage capacitor Cst may be electrically connected to the switching thin-film transistor T2 and a driving voltage line PL, and may store a voltage corresponding to a difference between a voltage received from the switching thin-film transistor T2 and a driving voltage ELVDD supplied to the driving voltage line PL.

The driving thin-film transistor T1 may be electrically connected to the driving voltage line PL and the storage capacitor Cst, and may control driving current flowing through the display element DPE from the driving voltage line PL in response to a value of the voltage stored in the storage capacitor Cst. The display element DPE may emit light having a certain luminance according to the driving current. A counter electrode of the display element DPE may receive a common voltage ELVSS.

Although the pixel circuit PC includes two thin-film transistors and one storage capacitor in FIG. 3, the pixel circuit PC may include three or more thin-film transistors.

Figure 4:
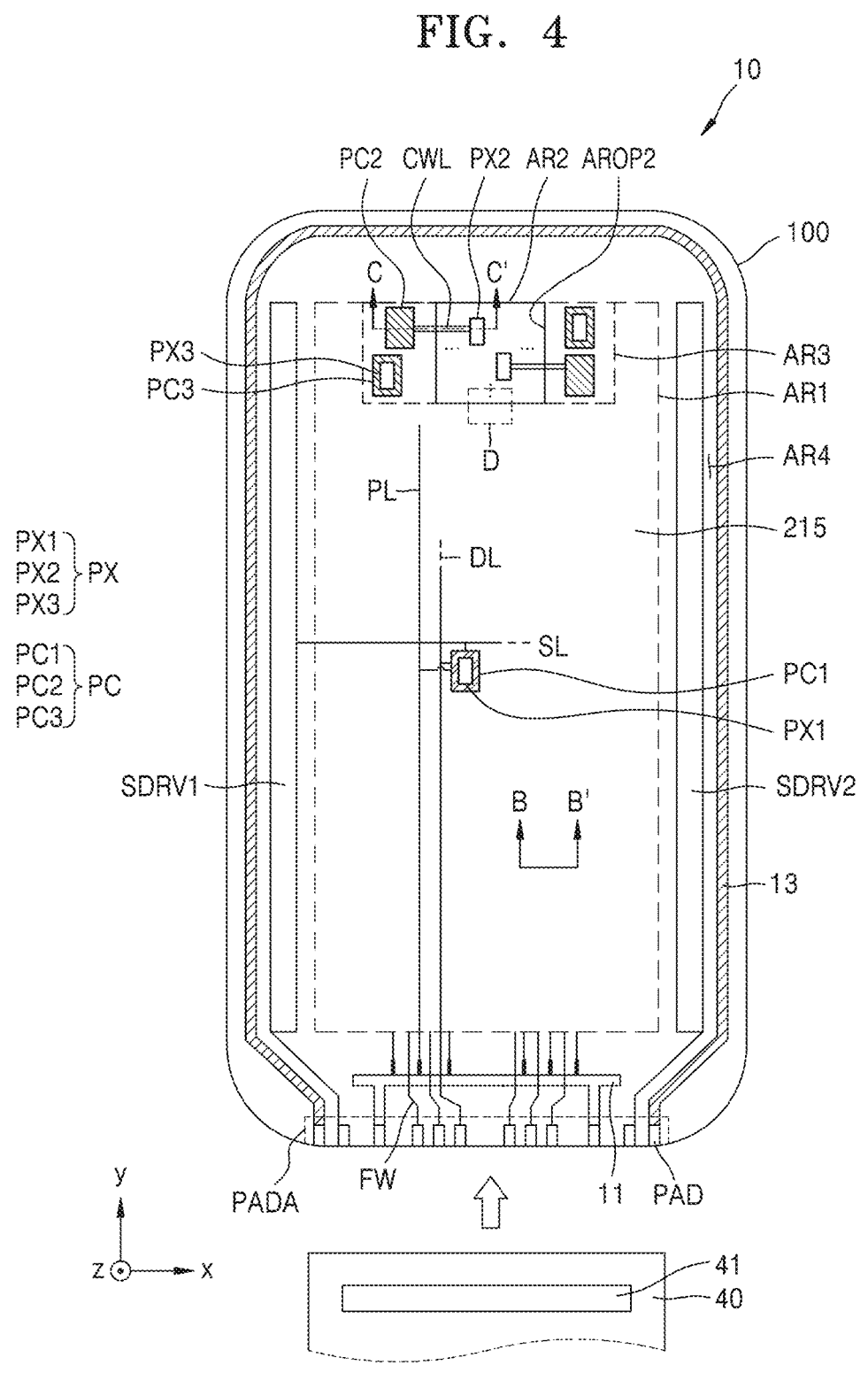
FIG. 4 is a plan view illustrating a display panel, according to an embodiment.

FIG. 4 is a plan view illustrating the display panel 10, according to an embodiment. In FIG. 4, the same elements as those of FIG. 1 are denoted by the same reference numerals, and thus a repeated description thereof will be omitted.

Referring to FIG. 4, the display panel 10 may include the substrate 100, the pixel circuit PC, the pixel PX, and a pixel-defining film 215. In an embodiment, the substrate 100 may include the first area AR1, the second area AR2, the third area AR3, and the fourth area AR4. The first area AR1 may surround at least part of the second area AR2 and the third area AR3. The third area AR3 may be adjacent to the second area AR2. The third area AR3 may be located on a side of the second area AR2. The fourth area AR4 may surround at least part of the first area AR1. The fourth area AR4 may surround at least part of the first area AR1, the second area AR2, and the third area AR3.

The pixel circuit PC may include the first pixel circuit PC1, the second pixel circuit PC2, and the third pixel circuit PC3. In an embodiment, the first pixel circuit PC1 may be located in the first area AR1. The second pixel circuit PC2 and the third pixel circuit PC3 may be located in the third area AR3. The pixel circuit PC may not be located in the second area AR2. In some embodiments, the second pixel circuit PC2 may be located in the fourth area AR4. In this case, the connection wiring CWL may extend from the fourth area AR4 to the second area AR2, and the third area AR3 may be omitted.

The pixel PX may be implemented using a display element such as an organic light-emitting diode. The pixel PX may include the first pixel PX1, the second pixel PX2, and the third pixel PX3. The first pixel PX1 may be located in the first area AR1. The first pixel PX1 may be electrically connected to the first pixel circuit PC1. In an embodiment, the first pixel PX1 may overlap the first pixel circuit PC1 in the plan view. The second pixel PX2 may be located in the second area AR2. The second pixel PX2 may be electrically connected to the second pixel circuit PC2. The second pixel PX2 may be electrically connected to the second pixel circuit PC2 through the connection wiring CWL. The third pixel PX3 may be located in the third area AR3. The third pixel PX3 may be electrically connected to the third pixel circuit PC3. In an embodiment, the third pixel PX3 may overlap the third pixel circuit PC3 in the plan view.

A plurality of pixels PX may be provided, and the plurality of pixels PX may display an image by emitting light. In an embodiment, a plurality of first pixels PX1, a plurality of second pixels PX2, and a plurality of third pixels PX3 may be provided. The plurality of first pixels PX1, the plurality of second pixels PX2, and the plurality of third pixels PX3 may display one image, or may each display an independent image.

In an embodiment, a resolution of the display panel 10 in the second area AR2 and/or the third area AR3 may be equal to or lower than a resolution of the display panel in the first area AR1. For example, a resolution of the display panel 10 in the second area AR2 and/or the third area AR3 may be about 1/1, 1/2, 3/8, 1/3, 1/4, 2/9, 1/8, 1/9, or 1/16 of a resolution of the display panel 10 in the first area AR1.

The pixel-defining film 215 may be located on the substrate 100. The pixel-defining film 215 may define the first pixel PX1. In other words, the pixel-defining film 215 may define an emission area of the first pixel PX1. In an embodiment, the pixel-defining film 215 may define the third pixel PX3. In other words, the pixel-defining film 215 may define an emission area of the third pixel PX3.

The pixel-defining film 215 may define a second area opening portion AROP2 overlapping the second area AR2. In an embodiment, the second area opening portion AROP2 may overlap the entirety of the second area AR2 in the plan view. The second area opening portion AROP2 may overlap the plurality of second pixels PX2. Accordingly, a transmittance (e.g., a light transmittance) of the display panel 10 in the second area AR2 may increase.

In an embodiment, the pixel-defining film 215 may include an organic insulating material. In another embodiment, the pixel-defining film 215 may include an inorganic insulating material such as silicon nitride (SiN$_x$), silicon oxynitride (SiON), or silicon oxide (SiO$_2$). In another embodiment, the pixel-defining film 215 may include an organic insulating material and an inorganic insulating material. In some embodiments, the pixel-defining film 215 may include a light-blocking material, and may be black. The light-blocking material may include a resin or paste including carbon black, carbon nanotubes, or a black dye, metal particles such as nickel, aluminum, molybdenum, or an alloy thereof, metal oxide particles (e.g., chromium oxide), or metal nitride particles (e.g., chromium nitride). When the pixel-defining film 215 includes the light-blocking material, reflection of external light by metal structures located under the pixel-defining film 215 may be reduced.

The fourth area AR4 may be a non-display area where the pixel PX is not located. In an embodiment, the display panel 10 may further include a first scan driving circuit SDRV1, a second scan driving circuit SDRV2, a pad PAD, a driving voltage supply line 11, and a common voltage supply line 13 located in the fourth area AR4.

Any one of the first scan driving circuit SDRV1 and the second scan driving circuit SDRV2 may apply a scan signal to the pixel circuit PC through the scan line SL. In an embodiment, the first scan driving circuit SDRV1 and the second scan driving circuit SDRV2 may be located opposite to each other with the first area AR1 therebetween. In an embodiment, any one of the plurality of pixels PX may receive a scan signal from the first scan driving circuit SDRV1, and another one of the plurality of pixels PX may receive a scan signal from the second scan driving circuit SDRV2.

The pad PAD may be located in a pad area PADA that is a side portion of the fourth area AR4. The pad PAD may be exposed without being covered by an insulating layer and may be connected to a display circuit board 40. A display driver 41 may be located on the display circuit board 40.

The display driver 41 may generate a signal transmitted to the first scan driving circuit SDRV1 and the second scan driving circuit SDRV2. The display driver 41 may generate a data signal, and the generated data signal may be transmitted to the pixel circuit PC through a fan-out wiring FW and the data line DL connected to the fan-out wiring FW.

The display driver 41 may supply the driving voltage ELVDD (see FIG. 3) to the driving voltage supply line 11, and may supply the common voltage ELVSS (see FIG. 3) to the common voltage supply line 13. The driving voltage ELVDD may be supplied to the pixel circuit PC through the driving voltage line PL electrically connected to the driving voltage supply line 11, and the common voltage ELVSS may be supplied to a counter electrode of a display element electrically connected to the common voltage supply line 13.

Figure 5:
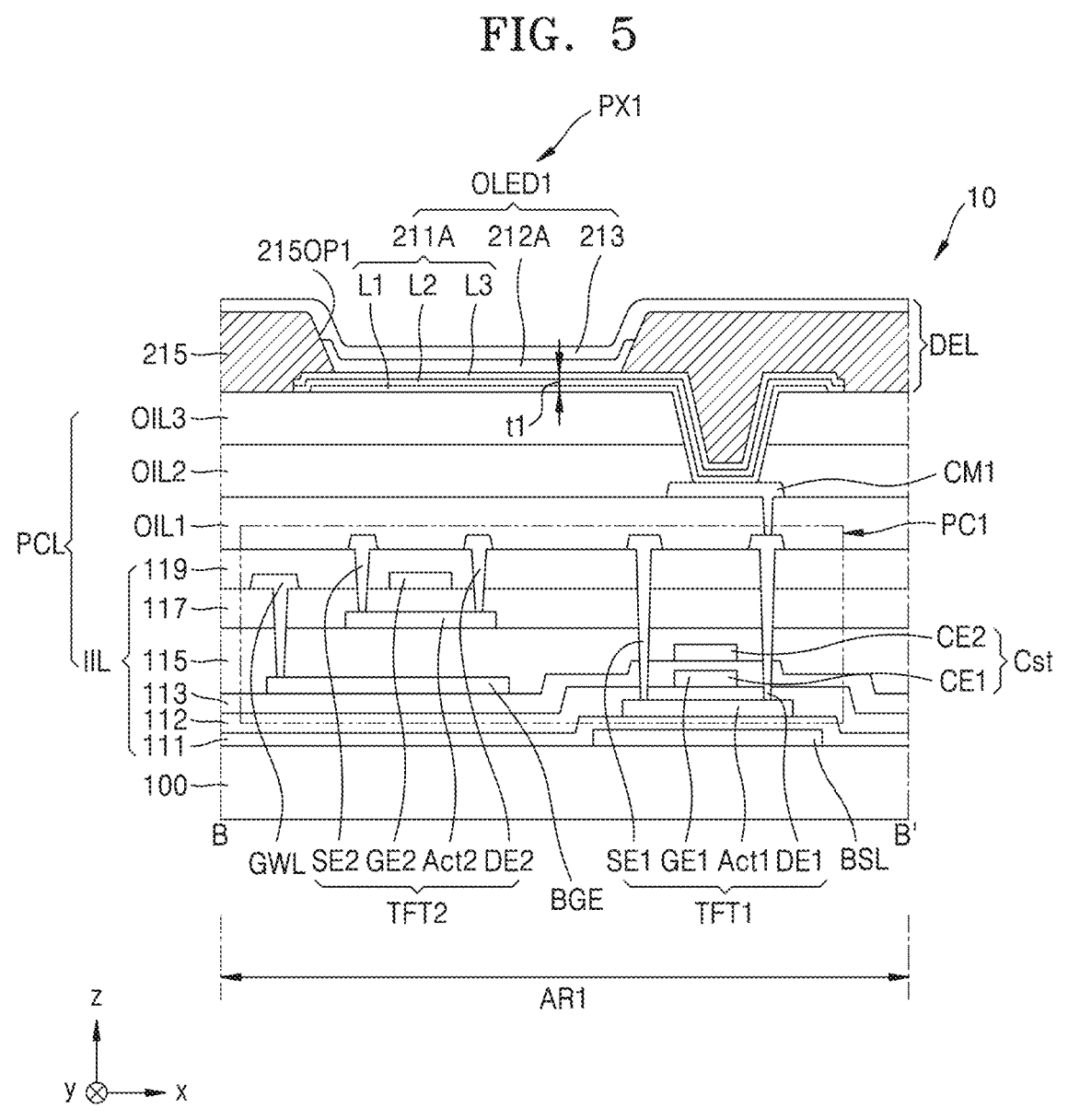

FIG. 5 is a cross-sectional view taken along line B-B' of the display panel 10 of FIG. 4.

Referring to FIG. 5, the display panel 10 may include the substrate 100, the pixel circuit layer PCL, and the display element layer DEL.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the substrate 100 may have a multi-layer structure including a base layer including the polymer resin and a barrier layer (not shown). The substrate 100 including the polymer resin may be flexible, rollable, or bendable.

The pixel circuit layer PCL may be located on the substrate 100. The pixel circuit layer PCL may include the first pixel circuit PC1, an inorganic insulating layer IIL, a first organic insulating layer OIL1, a first connection electrode CM1, a second organic insulating layer OIL2, and a third organic insulating layer OIL3. In an embodiment, the inorganic insulating layer IIL may include a buffer layer 111, a first gate insulating layer 112, a second gate insulating layer 113, a first inorganic insulating layer 115, a second inorganic insulating layer 117, and an interlayer insulating layer 119.

The first pixel circuit PC1 may be located in the first area AR1. The first pixel circuit PC1 may include a first thin-film transistor TFT1, a second thin-film transistor TFT2, and a storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second drain electrode DE2, and a second source electrode SE2. The storage capacitor Cst may include a lower electrode CE1 and an upper electrode CE2.

The buffer layer 111 may be located on the substrate 100. The buffer layer 111 may include an inorganic insulating material such as silicon nitride (SiN$_x$), silicon oxynitride (SiON), or silicon oxide (SiO$_2$), and may have a single or multi-layer structure including the inorganic insulating material.

The first semiconductor layer Act1 may include a silicon semiconductor. The first semiconductor layer Act1 may include polysilicon. Alternatively, the first semiconductor layer Act1 may include amorphous silicon. In some embodiments, the first semiconductor layer Act1 may include an oxide semiconductor, or may include an organic semiconductor. The first semiconductor layer Act1 may include a channel region, and a drain region and a source region located on opposite sides of the channel region. The first gate electrode GE1 may overlap the channel region in the plan view.

The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), or titanium (Ti), and may have a single or multi-layer structure including the above material.

The first gate insulating layer 112 may be located between the first semiconductor layer Act1 and the first gate electrode GE1. Accordingly, the first semiconductor layer Act1 may be insulated from the first gate electrode GE1. The first gate insulating layer 112 may include an inorganic insulating material such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZnO).

The second gate insulating layer 113 may cover the first gate electrode GE1. The second gate insulating layer 113 may be located on the first gate electrode GE1. The second gate insulating layer 113 may include an inorganic insulating material such as silicon oxide (SiO$_2$), silicon nitride (SiN$_x$), silicon oxynitride (SiON), aluminum oxide (Al$_2$O$_3$), titanium oxide ($TiO_2$), tantalum oxide ($Ta_2O_5$), hafnium oxide ($HfO_2$), and/or zinc oxide (ZnO), like the first gate insulating layer 112.

The upper electrode CE2 may be located on the second gate insulating layer 113. The upper electrode CE2 may overlap the first gate electrode GE1 that is located below the upper electrode CE2 in the plan view. In this case, the upper electrode CE2 and the first gate electrode GE1 may overlap each other with the second gate insulating layer 113 therebetween to constitute the storage capacitor Cst. That is, the first gate electrode GE1 of the first thin-film transistor TFT1 may function as the lower electrode CE1 of the storage capacitor Cst.

As such, the storage capacitor Cst and the first thin-film transistor TFT1 may overlap each other in the plan view. In some embodiments, the storage capacitor Cst may not overlap the first thin-film transistor TFT1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The first inorganic insulating layer 115 may cover the upper electrode CE2. In an embodiment, the first inorganic insulating layer 115 may cover the first gate electrode GE1. The first inorganic insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The first inorganic insulating layer 115 may have a single or multi-layer structure including the inorganic insulating material.

The second semiconductor layer Act2 may be located on the first inorganic insulating layer 115. In an embodiment, the second semiconductor layer Act2 may include a channel region, and a source region and a drain region located on opposite sides of the channel region. The second semiconductor layer Act2 may include an oxide semiconductor. For example, the second semiconductor layer Act2 may be formed of or include a Zn oxide-based material such as Zn oxide, In—Zn oxide, or Ga—In—Zn oxide. Alternatively, the second semiconductor layer Act2 may be formed of or include an In—Ga—Zn—O ("IGZO"), In—Sn—Zn—O ("ITZO"), or In—Ga—Sn—Zn—O ("IGTZO") semiconductor in which a metal such as indium (In), gallium (Ga), or tin (Sn) is contained in zinc oxide (ZnO).

The source region and the drain region of the second semiconductor layer Act2 may be formed by adjusting a carrier concentration of an oxide semiconductor to make the oxide semiconductor conductive. For example, the source region and the drain region of the second semiconductor layer Act2 may be formed by increasing a carrier concentration through plasma treatment using a hydrogen-based gas, a fluorine based gas, or a combination thereof on an oxide semiconductor.

The second inorganic insulating layer 117 may cover the second semiconductor layer Act2. The second inorganic insulating layer 117 may be located between the second semiconductor layer Act2 and the second gate electrode GE2. In an embodiment, the second inorganic insulating layer 117 may be entirely located on the substrate 100. In another embodiment, the second inorganic insulating layer 117 may be patterned according to a shape of the second gate electrode GE2. The second inorganic insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The second inorganic insulating layer 117 may have a single or multi-layer structure including the above inorganic insulating material.

The second gate electrode GE2 may be located on the second inorganic insulating layer 117. The second gate electrode GE2 may overlap the second semiconductor layer Act2 in the plan view. The second gate electrode GE2 may overlap the channel region of the second semiconductor layer Act2. The second gate electrode GE2 may include a conductive material including molybdenum (Mo), aluminum (Al), copper (Cu), or titanium (Ti), and may have a single or multi-layer structure including the above material.

The interlayer insulating layer 119 may cover the second gate electrode GE2. The interlayer insulating layer 119 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 119 may have a single or multi-layer structure including the above inorganic insulating material.

The first source electrode SE1 and the first drain electrode DE1 may be located on the interlayer insulating layer 119. The first source electrode SE1 and the first drain electrode DE1 may be connected to the first semiconductor layer Act1. The first source electrode SE1 and the first drain electrode DE1 may be connected to the first semiconductor layer Act1 through contact holes defined in insulating layers.

The second source electrode SE2 and the second drain electrode DE2 may be located on the interlayer insulating layer 119. The second source electrode SE2 and the second drain electrode DE2 may be electrically connected to the second semiconductor layer Act2. The second source electrode SE2 and the second drain electrode DE2 may be electrically connected to the second semiconductor layer Act2 through contact holes defined in insulating layers.

Each of the first source electrode SE1, the first drain electrode DE1, the second source electrode SE2, and the second drain electrode DE2 may include a material having high conductivity. Each of the first source electrode SE1, the first drain electrode DE1, the second source electrode SE2, and the second drain electrode DE2 may include a conductive material including molybdenum (Mo), aluminum (Al), copper (Cu), or titanium (Ti), and may have a single or multi-layer structure including the above material. In an embodiment, each of the first source electrode SE1, the first drain electrode DE1, the second source electrode SE2, and the second drain electrode DE2 may have a multi-layer structure including Ti/Al/Ti.

The first thin-film transistor TFT1 including the first semiconductor layer Act1 including a silicon semiconductor may have high reliability. Accordingly, when the first thin-film transistor TFT1 is used as a driving thin-film transistor, the display panel 10 having high quality may be realized.

Because an oxide semiconductor has high carrier mobility and small leakage current, voltage drop may not be large even when a driving time is long. That is, because a color change in an image due to voltage drop is not large even during low frequency driving, low frequency driving is possible. As such, because an oxide semiconductor has small leakage current, when an oxide semiconductor is applied to at least one of thin-film transistors other than a driving thin-film transistor, leakage current may be prevented and power consumption may be reduced. For example, the second thin-film transistor TFT2 may be used as a switching thin-film transistor.

A lower gate electrode BGE may be located under the second semiconductor layer Act2. In an embodiment, the lower gate electrode BGE may be located between the second gate insulating layer 113 and the first inorganic insulating layer 115. In an embodiment, the lower gate electrode BGE may receive a gate signal. In this case, the second thin-film transistor TFT2 may have a dual gate electrode structure in which gate electrodes are located over and under the second semiconductor layer Act2.

In an embodiment, a gate wiring GWL may be located between the second inorganic insulating layer 117 and the interlayer insulating layer 119. In an embodiment, the gate wiring GWL may be electrically connected to the lower gate electrode BGE through a contact hole defined in the first inorganic insulating layer 115 and the second inorganic insulating layer 117.

In an embodiment, a lower shielding layer BSL may be located between the substrate 100 and the first pixel circuit PC1 overlapping the first area AR1. In an embodiment, the lower shielding layer BSL may overlap the first thin-film transistor TFT1 in the plan view. A constant voltage may be applied to the lower shielding layer BSL. As the lower shielding layer BSL is located under the first thin-film transistor TFT1, the first thin-film transistor TFT1 may be hardly affected by ambient interference signals, thereby effectively improving reliability.

The lower shielding layer BSL may include a transparent conductive material. In an embodiment, the lower shielding layer BSL may include a transparent conducting oxide (TCO). For example, the lower shielding layer BSL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The first organic insulating layer OIL1 may cover the first source electrode SE1, the first drain electrode DE1, the second source electrode SE2, and the second drain electrode DE2. The first organic insulating layer OIL1 may include an organic material. For example, the first organic insulating layer OIL1 may include an organic insulating material such as a general-purpose polymer (e.g., polymethyl methacrylate ("PMMA") or polystyrene ("PS")), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The first connection electrode CM1 may be located on the first organic insulating layer OIL1. In this case, the first connection electrode CM1 may be connected to the first drain electrode DE1 or the first source electrode SE1 through a contact hole defined in the first organic insulating layer OIL1.

The first connection electrode CM1 may include a material having high conductivity. The first connection electrode CM1 may include a conductive material including molybdenum (Mo), aluminum (Al), copper (Cu), or titanium (Ti), and may have a single or multi-layer structure including the above material. In an embodiment, the first connection electrode CM1 may have a multi-layer structure including Ti/Al/Ti.

The second organic insulating layer OIL2 and the third organic insulating layer OIL3 may cover the first connection electrode CM1. Each of the second organic insulating layer OIL2 and the third organic insulating layer OIL3 may include an organic material. At least one of the second organic insulating layer OIL2 and the third organic insulating layer OIL3 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The display element layer DEL may be located on the pixel circuit layer PCL. The display element layer DEL may include a display element. In an embodiment, the display element layer DEL may include a first organic light-emitting diode OLED1 as a first display element located in the first area AR1. The first organic light-emitting diode OLED1 may be located on the third organic insulating layer OIL3.

The first organic light-emitting diode OLED1 may be electrically connected to the first pixel circuit PC1. In the first area AR1, the first organic light-emitting diode OLED1 may be electrically connected to the first pixel circuit PC1 to implement the first pixel PX1. In an embodiment, the first organic light-emitting diode OLED1 may overlap the first pixel circuit PC1 in the plan view. The first organic light-emitting diode OLED1 may include a first electrode 211A, a first emission layer 212A, and a counter electrode 213.

The first electrode 211A may be located on the third organic insulating layer OIL3. The first electrode 211A may be a pixel electrode. The first electrode 211A may be electrically connected to the first connection electrode CM1 through a contact hole provided in the second organic insulating layer OIL2 and the third organic insulating layer OIL3.

The first electrode 211A may have a first thickness t1. The first thickness t1 may be a distance between a bottom surface of the first electrode 211A and a corresponding location at a top surface of the first electrode 211A in the plan view. For example, the bottom surface of the first electrode 211A may face the substrate 100. The top surface of the first electrode 211A that is opposite to the bottom surface of the first electrode 211A may face the first emission layer 212A.

In an embodiment, the first electrode 211A may include a plurality of layers. In an embodiment, the first electrode 211A may include a first layer L1 and a second layer L2. In another embodiment, the first electrode 211A may include the first layer L1, the second layer L3, and a third layer L3.

The first layer L1 may include at least one of indium (In), tin (Sn), and oxygen (O). In an embodiment, the first layer L1 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The second layer L2 may be located on the first layer L1. The second layer L2 may cover the first layer L1. In an embodiment, the second layer L2 may cover a top surface of the first layer L1 and a side surface of the first layer L1. The second layer L2 may include a reflective film. In an embodiment, the second layer L2 may include silver (Ag), magnesium (Mg), aluminum (Al), platinum (Pt), palladium (Pd), gold (Au), nickel (Ni), neodymium (Nd), iridium (Ir), chromium (Cr), or a compound thereof.

The third layer L3 may be located on the second layer L2. The third layer L3 may include at least one of indium (In), tin (Sn), and oxygen (O). In an embodiment, the third layer L3 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The pixel-defining film 215 may define a first electrode opening portion 215OP1 through which a central portion of the first electrode 211A is exposed, and may be located on the first electrode 211A. The first electrode opening portion 215OP1 may define an emission area of light emitted by the first organic light-emitting diode OLED1.

The pixel-defining film 215 may include an organic insulating material. In another embodiment, the pixel-defining film 215 may include an inorganic insulating material such as silicon nitride ($SiN_x$), silicon oxynitride (SiON), or silicon oxide ($SiO_2$). In another embodiment, the pixel-defining film 215 may include an organic insulating material and an inorganic insulating material. In some embodiments, the pixel-defining film 215 may include a light-blocking material, and may be black. The light-blocking material may include a resin or paste including carbon black, carbon nanotubes, or a black dye, metal particles such as nickel, aluminum, molybdenum, or an alloy thereof, metal oxide particles (e.g., chromium oxide), or metal nitride particles (e.g., chromium nitride). When the pixel-defining film 215 includes the light-blocking material, reflection of external light by metal structures located under the pixel-defining film 215 may be reduced.

The first emission layer 212A may be located on the first electrode 211A. The first emission layer 212A may overlap the first electrode opening portion 215OP1 in the plan view. The first emission layer 212A may include a low molecular weight material or a high molecular weight material, and may emit red light, green light, blue light, or white light. The first emission layer 212A may include any of various organic materials such as copper phthalocyanine (CuPc), N,N'-Di (naphthalene-1-yl)-N,N'-diphenyl-benzidine (NPB), or tris-8-hydroxyquinoline aluminum (Alq3).

In some embodiments, a hole injection layer ("HIL") and/or a hole transport layer ("HTL") may be located between the first electrode 211A and the first emission layer 212A. In an embodiment, the hole transport layer may include poly(3,4-ethylenedioxythiophene) ("PEDOT"), and the first emission layer 212A may include a polymer material such as a polyphenylene vinylene ("PPV")-based material or a polyfluorene-based material.

The counter electrode 213 may be located on the first emission layer 212A. The counter electrode 213 may be provided of or include a conductive material having a low work function. For example, the counter electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 213 may further include a layer provided of ITO, IZO, ZnO, or $In_2O_3$ on the (semi)transparent layer including the above material.

In some embodiments, an electron transport layer ("ETL") and/or an electron injection layer ("EIL") may be located between the first emission layer 212A and the counter electrode 213.

Figure 6A:
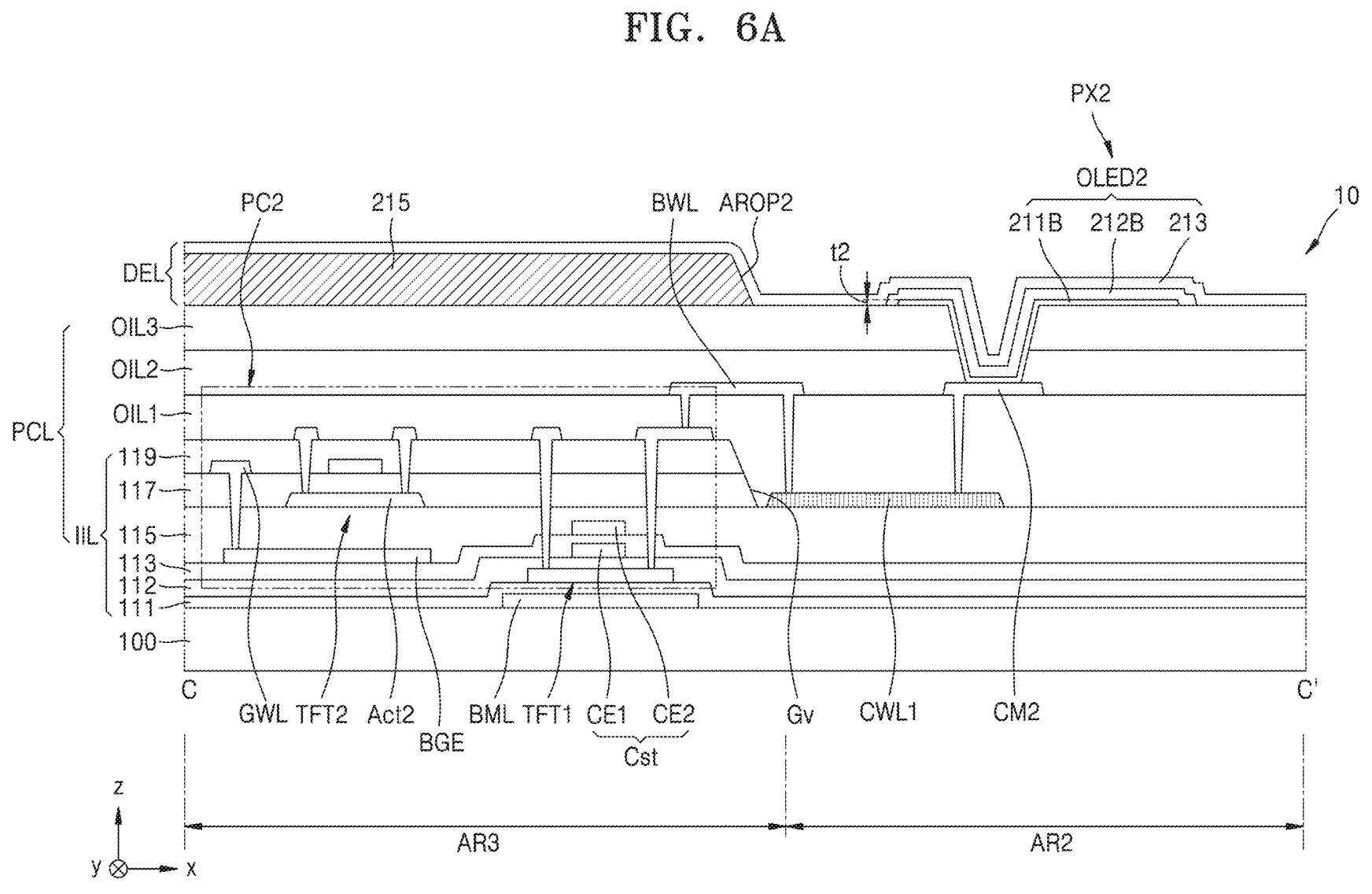
Figure 6B:
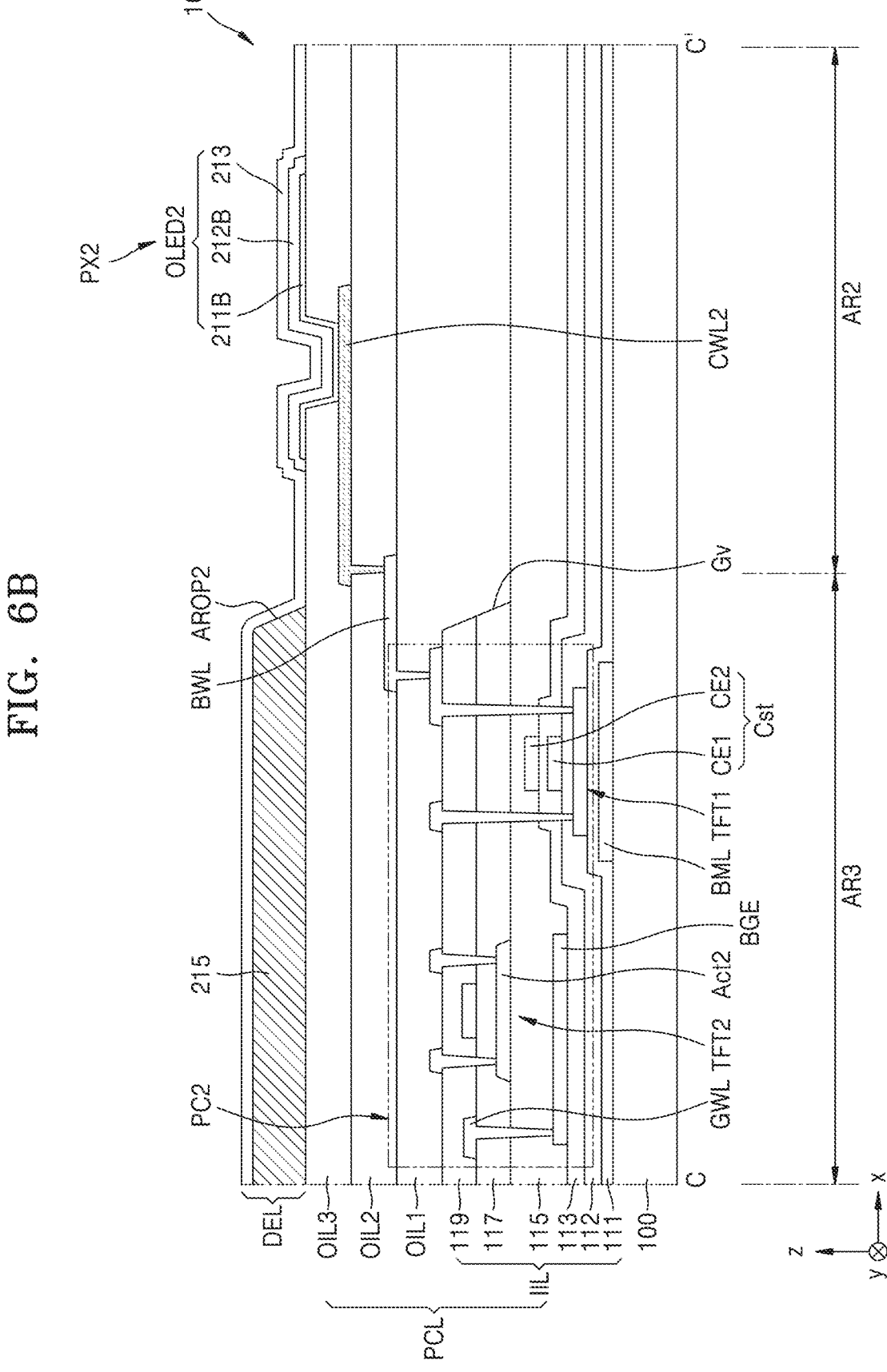

FIGS. 6A and 6B are cross-sectional views taken along line C-C' of the display panel 10 of FIG. 4, according to various embodiments. In FIGS. 6A and 6B, the same elements as those in FIG. 5 are denoted by the same reference numerals, and thus a repeated description thereof will be omitted.

Referring to FIGS. 6A and 6B, the display panel 10 may include the substrate 100, the pixel circuit layer PCL, and the display element layer DEL. The display element layer DEL may include a second organic light-emitting diode OLED2 as a second display element. The substrate 100 may include the second area AR2 and the third area AR3 that is adjacent to the second area AR2.

The pixel circuit layer PCL may be located on the substrate 100. The pixel circuit layer PCL may include the second pixel circuit PC2, the inorganic insulating layer IIL, a connection wiring CWL1 and CWL2, the first organic insulating layer OIL1, a bridge wiring BWL, a second connection electrode CM2, the second organic insulating layer OIL2, and the third organic insulating layer OIL3. In an embodiment, the inorganic insulating layer IIL may include the buffer layer 111, the first gate insulating layer 112, the second gate insulating layer 113, the first inorganic insulating layer 115, the second inorganic insulating layer 117, and the interlayer insulating layer 119.

The second pixel circuit PC2 may be located in the third area AR3. In other words, the second pixel circuit PC2 may not be located in the second area AR2. The second pixel circuit PC2 may include the first thin-film transistor TFT1, the second thin-film transistor TFT2, and the storage capacitor Cst.

In an embodiment, the inorganic insulating layer IL may define a groove Gv or a hole overlapping the second area AR2 in the plan view. The groove Gv may have a shape obtained by removing a part of the inorganic insulating layer K. For example, the buffer layer 111, the first gate insulating layer 112, the second gate insulating layer 113, and the first inorganic insulating layer 115 may be continuously located in the second area AR2 and the third area AR3. Each of the second inorganic insulating layer 117 and the interlayer insulating layer 119 may define an opening overlapping the second area AR2 in the plan view. The opening of the second inorganic insulating layer 117 and the opening of the interlayer insulating layer 119 may be formed through separate processes, respectively, or may be simultaneously formed through the same process. When the opening of the second inorganic insulating layer 117 and the opening of the interlayer insulating layer 119 are formed through separate processes, respectively, the groove Gv may have a stepped shape.

The first organic insulating layer OIL1 may fill the groove Gv. A transmittance (e.g., a light transmittance) of the first organic insulating layer OIL1 may be higher than a transmittance of the second inorganic insulating layer 117 and/or the interlayer insulating layer 119. Accordingly, a transmittance (e.g., a light transmittance) of the second area AR2 may increase.

Although the inorganic insulating layer IIL defines the groove Gv in FIGS. 6A and 6B, in another embodiment, the inorganic insulating layer IIL may not define the groove Gv. In this case, the second inorganic insulating layer 117 and the interlayer insulating layer 119 may be continuously located in the second area AR2. In another embodiment, the inorganic insulating layer IIL may define a hole that overlaps the second area AR2 in the plan view and through which a top surface of the substrate 100 is exposed.

The connection wiring may be electrically connected to the second pixel circuit PC2. The connection wiring may electrically connect the second pixel circuit PC2 to the second organic light-emitting diode OLED2 which is second display element. The connection wiring may extend from the third area AR3 to the second area AR2. The connection wiring may include a transparent conducting oxide.

The connection wiring may include at least one of a first connection wiring CWL1 and a second connection wiring CWL2. The first connection wiring CWL1 may be located between the substrate 100 and an organic insulating layer. In an embodiment, the first connection wiring CWL1 may be located between the substrate 100 and the first organic insulating layer OIL1. The second connection wiring CWL2 may be located between an organic insulating layer and the display element layer DEL. In an embodiment, the second connection wiring CWL2 may be located between the first organic insulating layer OIL1 and the display element layer DEL.

Referring to FIG. 6A, the first connection wiring CWL1 may be located between the first inorganic insulating layer 115 and the first organic insulating layer OIL1. In an embodiment, the first connection wiring CWL1 may be electrically connected to the second pixel circuit PC2 through the bridge wiring BWL located between the first organic insulating layer OIL1 and the second organic insulating layer OIL2. In an embodiment, the bridge wiring BWL may be electrically connected to the second pixel circuit PC2 through a contact hole defined in the first organic insulating layer OIL1. The bridge wiring BWL may be electrically connected to the first connection wiring CWL1 through another contact hole defined in the first organic insulating layer OIL1.

The first connection wiring CWL1 may be electrically connected to the second connection electrode CM2 located between the first organic insulating layer OIL1 and the second organic insulating layer OIL2. The second connection electrode CM2 may be electrically connected to the first connection wiring CWL1 through a contact hole defined in the first organic insulating layer OIL1.

In an embodiment, at least one of the bridge wiring BWL and the second connection electrode CM2 may include a material having high conductivity. At least one of the bridge wiring BWL and the second connection electrode CM2 may include a conductive material including molybdenum (Mo), aluminum (Al), copper (Cu), or titanium (Ti), and may have a single or multi-layer structure including the above material. At least one of the bridge wiring BWL and the second connection electrode CM2 may have a multi-layer structure including Ti/Al/Ti. In an embodiment, the bridge wiring BWL and the second connection electrode CM2 may include the same material.

The second organic insulating layer OIL2 and the third organic insulating layer OIL3 may be located on the bridge wiring BWL and the second connection electrode CM2. The second connection electrode CM2 may be electrically connected to the second organic light-emitting diode OLED2 through a contact hole defined in the second organic insulating layer OIL2 and a contact hole defined in the third organic insulating layer OIL3. Accordingly, the second organic light-emitting diode OLED2 may be electrically connected to the second pixel circuit PC2, and may be driven by the second pixel circuit PC2.

Referring to FIG. 6B, the second connection wiring CWL2 may be located between the second organic insulating layer OIL2 and the third organic insulating layer OIL3. In an embodiment, the second connection wiring CWL2 may be electrically connected to the second pixel circuit PC2 through the bridge wiring BWL located between the first organic insulating layer OIL1 and the second organic insulating layer OIL2. In an embodiment, the bridge wiring BWL may be electrically connected to the second pixel circuit PC2 through a contact hole defined in the first organic insulating layer OIL1. The second connection wiring CWL2 may be electrically connected to the bridge wiring BWL through a contact hole defined in the second organic insulating layer OIL2.

The third organic insulating layer OIL3 may be located on the second connection wiring CWL2. The second connection wiring CWL2 may be electrically connected to the second organic light-emitting diode OLED2 through a contact hole defined in the third organic insulating layer OIL3. Accordingly, the second organic light-emitting diode OLED2 may be electrically connected to the second pixel circuit PC2, and may be driven by the second pixel circuit PC2.

Referring back to FIGS. 6A and 6B, the display element layer DEL may be located on the pixel circuit layer PCL. The display element layer DEL may include the pixel-defining film 215 and a display element. In an embodiment, the display element layer DEL may include the second organic light-emitting diode OLED2 as a second display element located in the second area AR2. The second organic light-emitting diode OLED2 may be located on the third organic insulating layer OIL3.

The pixel-defining film 215 may define a second area opening portion AROP2 overlapping the second area AR2 in the plan view. Accordingly, the second organic light-emitting diode OLED2 may be spaced apart from the pixel-defining film 215, and the display panel 10 may maintain a high transmittance (e.g., a light transmittance) in the second area AR2.

The second organic light-emitting diode OLED2 may be electrically connected to a pixel circuit. In the second area AR2, the second organic light-emitting diode OLED2 may be electrically connected to the second pixel circuit PC2 located in the third area AR3 to implement the second pixel PX2. The second organic light-emitting diode OLED2 may include a second electrode 211B, a second emission layer 212B, and the counter electrode 213.

The second electrode 211B may have a second thickness t2. The second thickness t2 may be a distance between a bottom surface of the second electrode 211B and a corresponding location at a top surface of the second electrode 211B in the plan view. For example, the bottom surface of the second electrode 211B may face the substrate 100. The top surface of the second electrode 211B that is opposite to the bottom surface of the second electrode 211B may face the second emission layer 212B. In an embodiment, the second thickness t2 may be less than the first thickness t1 (see FIG. 5).

The second electrode 211B may include at least one of indium (In) tin (Sn), and oxygen (O). In an embodiment, the second electrode 211B may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). Accordingly, a transmittance (e.g., a light transmittance) of the second electrode 211B may be high. Also, because the second electrode 211B does not include a reflective film including silver (Ag), a side surface of the second electrode 211B may not need to be covered by the pixel-defining film 215.

The second emission layer 212B may be located on the second electrode 211B. The second emission layer 212B may cover the second electrode 211B. In an embodiment, the second emission layer 212B may cover a side surface of the second electrode 211B. The second emission layer 212B may include a low molecular weight material or a high molecular weight material, and may emit red light, green light, blue light, or white light.

The counter electrode 213 may be located on the second emission layer 212B. In an embodiment, the second emission layer 212B may separate the second electrode 211B from the counter electrode 213. Accordingly, the second emission layer 212B may prevent or reduce a short circuit from occurring when the counter electrode 213 and the second electrode 211B contact each other.

Figure 7:
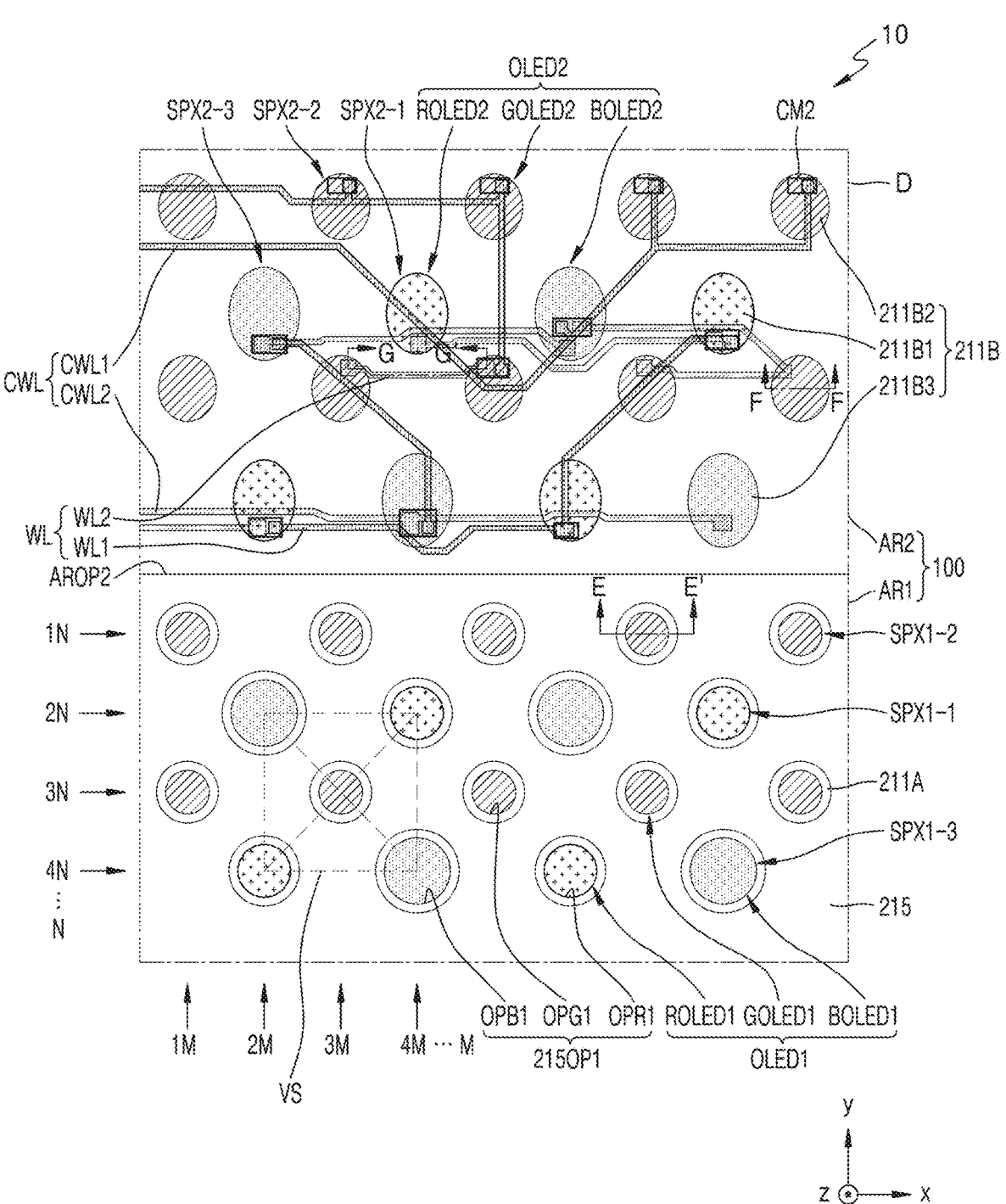
FIG. 7 is an enlarged view illustrating a portion D of the display panel of FIG. 4.

FIG. 7 is an enlarged view illustrating a portion D of the display panel 10 of FIG. 4.

Referring to FIG. 7, the display panel 10 may include the substrate 100, an organic light-emitting diode as a display element, the pixel-defining film 215, the connection wiring CWL, a wiring WL, and the second connection electrode CM2. The substrate 100 may include the first area AR1 and the second area AR2.

The organic light-emitting diode as a display element may be located in the first area AR1 and the second area AR2. The first organic light-emitting diode OLED1 as a first display element may be located in the first area AR1. In an embodiment, the first organic light-emitting diode OLED1 may include a first red organic light-emitting diode ROLED1, a first green organic light-emitting diode GOLED1, and a first blue organic light-emitting diode BOLED1. In an embodiment, a plurality of first red organic light-emitting diodes ROLED1, a plurality of first green organic light-emitting diodes GOLED1, and a plurality of first blue organic light-emitting diodes BOLED1 may be provided.

The first red organic light-emitting diode ROLED1, the first green organic light-emitting diode GOLED1, and the first blue organic light-emitting diode BOLED1 may implement a first red sub-pixel SPX1-1, a first green sub-pixel SPX1-2, and a first blue sub-pixel SPX1-3, respectively. The term 'sub-pixel' used herein refers to an emission area that is a minimum unit for forming an image. When the first organic light-emitting diode OLED1 is used as a first display element, an emission area of the first display element may be defined by the first electrode opening portion 215OP1 defined in the pixel-defining film 215. In an embodiment, the pixel-defining film 215 may cover an edge of the first electrode 211A.

In an embodiment, a first red sub-pixel opening portion OPR1 may define an emission area of the first red organic light-emitting diode ROLED1. A first green sub-pixel opening portion OPG1 may define an emission area of the first green organic light-emitting diode GOLED1. A first blue sub-pixel opening portion OPB1 may define an emission area of the first blue organic light-emitting diode BOLED1.

The first red sub-pixel SPX1-1, the first green sub-pixel SPX1-2, and the first blue sub-pixel SPX1-3 may be arranged in a pentile structure. In a first row 1N, a plurality of first green sub-pixels SPX1-2 may be spaced apart from one another by a certain interval. In a second row 2N adjacent to the first row 1N, a plurality of first red sub-pixels SPX1-1 and a plurality of first blue sub-pixels SPX1-3 may be alternately arranged. In a third row 3N adjacent to the second row 2N, a plurality of first green sub-pixels SPX1-2 may be spaced apart from one another by a certain interval. In a fourth row 4N adjacent to the third row 3N, a plurality of first red sub-pixels SPX1-1 and a plurality of first blue sub-pixels SPX1-3 may be alternately arranged. This sub-pixel arrangement may be repeated to an $N^{th}$ row. In an embodiment, each of the first red sub-pixel SPX1-1 and the first blue sub-pixel SPX1-3 may be larger than the first green sub-pixel SPX1-2.

The plurality of first green sub-pixels SPX1-2 located in the first row 1N may be alternately arranged with the plurality of first red sub-pixels SPX1-1 and the plurality of first blue sub-pixels SPX1-3 located in the second row 2N. Accordingly, in a first column 1M, a plurality of first green sub-pixels SPX1-2 may be spaced apart from one another by a certain interval. In a second column 2M adjacent to the first column 1M, a plurality of first red sub-pixels SPX1-1 and a plurality of first blue sub-pixels SPX1-3 may be alternately arranged. In a third column 3M adjacent to the second column 2M, a plurality of first green sub-pixels SPX1-2 may be spaced apart from one another by a certain interval. In a fourth column 4M adjacent to the third column 3M, a plurality of first red sub-pixels SPX1-1 and a plurality of first blue sub-pixels SPX1-3 may be alternately arranged. This sub-pixel arrangement may be repeated to an $M^{th}$ column.

When such a sub-pixel arrangement structure is differently expressed, the first green sub-pixel SPX1-2 may be located at the center of a virtual square VS. In an embodiment, the center point of the first green sub-pixel SPX1-2 may be the center point of the virtual square VS. The first red sub-pixels SPX1-1 and the first blue sub-pixels SPX1-3 may be located at vertexes of the virtual quadrangle VS, respectively. In an embodiment, the first red sub-pixels SPX1-1 may be located at a first vertex and a third vertex facing each other in a diagonal direction from among the vertexes of the virtual quadrangle VS, respectively. The first blue sub-pixels SPX1-3 may be located at a second vertex and a fourth vertex facing each other in a diagonal direction from among the vertexes of the virtual quadrangle VS, respectively. The virtual quadrangle VS may be variously modified to, for example, a rectangle, a rhombus, or a square.

Such a sub-pixel arrangement structure may be referred to as a pentile matrix (PENTILE™ Matrix) structure or a pentile structure, and a rendering driving method that represents a color by sharing adjacent sub-pixels may be used, thereby displaying an image having a high resolution with a small number of pixels.

Although the first red sub-pixel SPX1-1, the first green sub-pixel SPX1-2, and the first blue sub-pixel SPX1-3 are arranged in a pentile matrix structure in FIG. 7, the disclosure is not limited thereto. In another embodiment, the first red sub-pixel SPX1-1, the first green sub-pixel SPX1-2, and the first blue sub-pixel SPX1-3 may be arranged in any of various structures such as a stripe structure, a mosaic arrangement structure, or a delta arrangement structure.

The second organic light-emitting diode OLED2 as a second display element may be located in the second area AR2. The second organic light-emitting diode OLED2 may include the second electrode 211B. In an embodiment, the second organic light-emitting diode OLED2 may include a second red organic light-emitting diode ROLED2, a second green organic light-emitting diode GOLED2, and a second blue organic light-emitting diode BOLED2. In an embodiment, a plurality of second red organic light-emitting diodes ROLED2, a plurality of second green organic light-emitting diodes GOLED2, and a plurality of second blue organic light-emitting diodes BOLED2 may be provided.

The second red organic light-emitting diode ROLED2, the second green organic light-emitting diode GOLED2, and the second blue organic light-emitting diode BOLED2 may implement a second red sub-pixel SPX2-1, a second green sub-pixel SPX2-2, and a second blue sub-pixel SPX2-3, respectively. The second red sub-pixel SPX2-1, the second green sub-pixel SPX2-2, and the second blue sub-pixel SPX2-3 may be arranged in a pentile structure, like the first red sub-pixel SPX1-1, the first green sub-pixel SPX1-2, and the first blue sub-pixel SPX1-3.

When the second organic light-emitting diode OLED2 is used as a second display element, an emission area of the second display element may be defined by the area of the second electrode 211B. The second red organic light-emitting diode ROLED2 may include a second red sub-pixel electrode 211B1. The area of the second red sub-pixel electrode 211B1 may define an emission area of the second red organic light-emitting diode ROLED2. The second green organic light-emitting diode GOLED2 may include a second green sub-pixel electrode 211B2. The area of the second green sub-pixel electrode 211B2 may define an emission area of the second green organic light-emitting diode GOLED2. The second blue organic light-emitting diode BOLED2 may include a second blue sub-pixel electrode 211B3. The area of the second blue sub-pixel electrode 211B3 may define an emission area of the second blue organic light-emitting diode BOLED3.

The second organic light-emitting diode OLED2 may be electrically connected to the connection wiring CWL. The second organic light-emitting diode OLED2 may be electrically connected to a second pixel circuit through the connection wiring CWL. Accordingly, the second pixel circuit may not be located in the second area AR2, and a high transmittance (e.g., a light transmittance) of the display panel may be maintained in the second area AR2.

The connection wiring CWL may include at least one of the first connection wiring CWL1 and the second connection wiring CWL2. In an embodiment, the connection wiring CWL may include the first connection wiring CWL1 and the second connection wiring CWL2. In an embodiment, the first connection wiring CWL1 may be electrically connected to the second electrode 211B through the second connection electrode CM2.

Any one of a plurality of second organic light-emitting diodes OLED2 and another one of the plurality of second organic light-emitting diodes OLED2 may be electrically connected to each other. In an embodiment, any one of the plurality of second organic light-emitting diodes OLED2 may be electrically connected to another one of the plurality of second organic light-emitting diodes OLED2 through the wiring WL. Accordingly, one second pixel circuit may drive a plurality of second organic light-emitting diodes OLED2, and may maintain a high resolution in the second area AR2.

The wiring WL may include a transparent conducting oxide. For example, the wiring WL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The wiring WL may include at least one of a first wiring WL1 and a second wiring WL2. In an embodiment, the first wiring WL1 and the first connection wiring CWL1 may be located in the same layer and may include the same material. In an embodiment, the second electrode 211B may be electrically connected to the first wiring WL1 through the second connection electrode CM2. The second wiring WL2 and the second connection wiring CWL2 may be located in the same layer, and may include the same material. In an embodiment, the connection wiring CWL may electrically connect any one of a plurality of second organic light-emitting diodes OLED2 to another one of the plurality of second organic light-emitting diodes OLED2, like the wiring WL.

The second connection electrode CM2 may electrically connect the first connection wiring CWL1 to the second organic light-emitting diode OLED2. In an embodiment, the second connection electrode CM2 may electrically connect the first wiring WL1 to the second organic light-emitting diode OLED2. In an embodiment, the second connection electrode CM2 may electrically connect the connection wiring CWL to the wiring WL. In some embodiments, the second connection electrode CM2 may be omitted.

Figure 8:
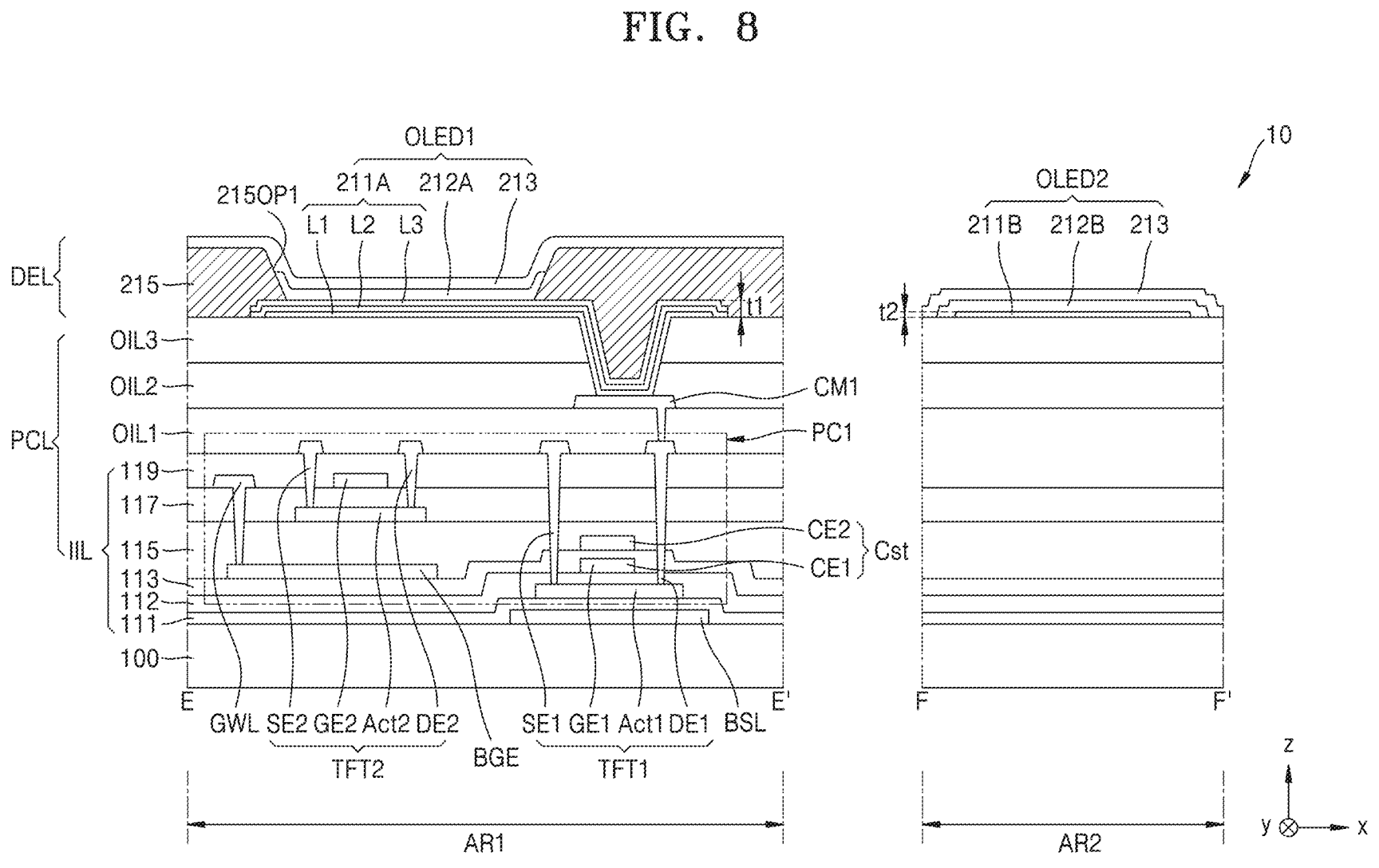

FIG. 8 is a cross-sectional view taken along lines E-E' and F-F' of the display panel 10 of FIG. 7. In FIG. 8, the same elements as those illustrated in FIGS. 5, 6A, and 6B are denoted by the same reference numerals, and thus a repeated description thereof will be omitted.

Referring to FIG. 8, the display panel 10 may include the substrate 100, the pixel circuit layer PCL, and the display element layer DEL. The substrate 100 may include the first area AR1 and the second area AR2.

The pixel circuit layer PCL may be located on the substrate 100. The pixel circuit layer PCL may include the first pixel circuit PC1, the inorganic insulating layer IIL, the first organic insulating layer OIL1, the first connection electrode CM1, the second organic insulating layer OIL2, and the third organic insulating layer OIL3.

The display element layer DEL may be located on the pixel circuit layer PCL. The display element layer DEL may include the first organic light-emitting diode OLED1 as a first display element located in the first area AR1, the second organic light-emitting diode OLED2 as a second display element located in the second area AR2, and the pixel-defining film 215. In an embodiment, the first organic light-emitting diode OLED1 and the second organic light-emitting diode OLED2 may be located on the third organic insulating layer OIL3.

The first organic light-emitting diode OLED1 may be electrically connected to the first pixel circuit PC1. The first organic light-emitting diode OLED1 may include the first electrode 211A, the first emission layer 212A, and the counter electrode 213. The first electrode 211A may have the first thickness t1.

In an embodiment, the first electrode 211A may include the first layer L1 and the second layer L2. In another embodiment, the first electrode 211A may include the first layer L1, the second layer L2, and the third layer L3. The second layer L2 and the third layer L3 may cover the first layer L1. In an embodiment, the second layer L2 may cover a top surface of the first layer L1 and a side surface of the first layer L1.

At least one of the first layer L1 and the third layer L3 may include at least one of indium (In), tin (Sn), and oxygen (O). The second layer L2 may include a reflective film. Accordingly, the first organic light-emitting diode OLED1 may emit light in one direction. For example, the first organic light-emitting diode OLED1 may emit light in a direction (e.g., a z direction) away from the substrate 100.

The first emission layer 212A may be located on the first electrode 211A. The first emission layer 212A may overlap the first electrode opening portion 215OP1 of the pixel-defining film 215 in the plan view.

The second organic light-emitting diode OLED2 may include the second electrode 211B, the second emission layer 212B, and the counter electrode 213. The second electrode 211B may have the second thickness t2. In an embodiment, the second thickness t2 may be less than the first thickness t1. In an embodiment, a difference between the second thickness t2 and the first thickness t1 may be a sum of a thickness of the second layer L2 and a thickness of the third layer L3. The second electrode 211B may include at least one of indium (In), tin (Sn), and oxygen (O). Accordingly, a transmittance (e.g., a light transmittance) of the second electrode 211B may be higher than a transmittance of the first electrode 211A. In an embodiment, the second electrode 211B may not include a reflective film. Accordingly, the second organic light-emitting diode OLED2 may emit light from opposite sides. For example, the second organic light-emitting diode OLED2 may emit light in a direction (e.g., -z direction) closer to the substrate 100 and a direction (e.g., z direction) away from the substrate 100.

The second emission layer 212B may be located on the second electrode 211B. The second emission layer 212B may cover a top surface of the second electrode 211B and a side surface of the second electrode 211B, and the counter electrode 213 may be located on the second emission layer 212B. Accordingly, the second emission layer 212B may prevent or reduce a short circuit from occurring when the counter electrode 213 and the second electrode 211B contact each other.

The pixel-defining film 215 may not overlap the second organic light-emitting diode OLED2 in the plan view. In other words, the pixel-defining film 215 may define a second area opening portion overlapping the second area AR2. Because the second electrode 211B does not include a reflective film including silver (Ag), a side surface of the second electrode 211B may not need to be covered by the pixel-defining film 215.

Unlike in the present embodiment, when the pixel-defining film 215 includes a light-blocking material and is located in the second area AR2, a transmittance (e.g., a light transmittance) of the second area AR2 may decrease. In the present embodiment, because the pixel-defining film 215 defines the second area opening portion, the display panel 10 may maintain a high transmittance (e.g., light transmittance) in the second area AR2.

Figure 9:
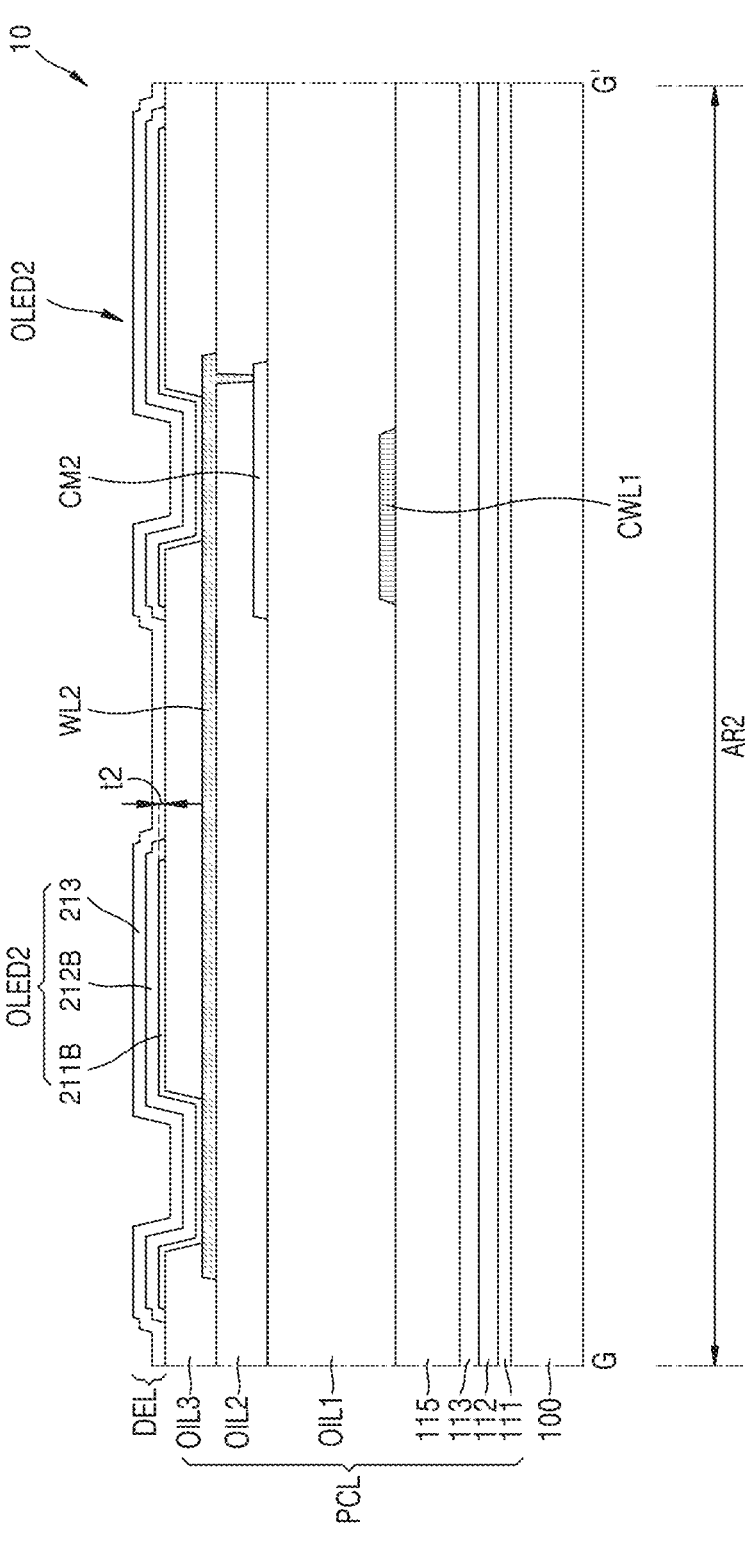
FIG. 9 is a cross-sectional view taken along line G-G' of the display panel of FIG. 7.

FIG. 9 is a cross-sectional view taken along line G-G' of the display panel 10 of FIG. 7. In FIG. 9, the same elements as those illustrated in FIGS. 6A, 6B, and 7 are denoted by the same reference numerals, and thus a repeated description thereof will be omitted.

Referring to FIG. 9, the display panel 10 may include the substrate 100 including the second area AR2, the pixel circuit layer PCL, and the display element layer DEL including the second organic light-emitting diode OLED2 as a second display element.

The pixel circuit layer PCL may be located on the substrate 100. The pixel circuit layer PCL may include the buffer layer 111, the first gate insulating layer 112, the second gate insulating layer 113, the first inorganic insulating layer 115, the first connection wiring CWL1, the first organic insulating layer OIL1, the second connection electrode CM2, the second organic insulating layer OIL2, the second wiring WL2, and the third organic insulating layer OIL3.

The first connection wiring CWL1 may be located between the substrate 100 and an organic insulating layer. In an embodiment, the first connection wiring CWL1 may be located between the first inorganic insulating layer 115 and the first organic insulating layer OIL1.

The second connection electrode CM2 may be located on the first organic insulating layer OIL1. In an embodiment, the second connection electrode CM2 may be located between the first organic insulating layer OIL1 and the second organic insulating layer OIL2.

A wiring may be located between the substrate 100 and the display element layer DEL. In an embodiment, the wiring may include a transparent conducting oxide.

In an embodiment, the wiring may include at least one of a first wiring and the second wiring WL2. In an embodiment, the first wiring and the first connection wiring CWL1 may be located on the same layer. For example, the first wiring may be located between the first inorganic insulating layer 115 and the first organic insulating layer OIL1. The second wiring WL2 and a second connection wiring may be located on the same layer. For example, the second wiring WL2 may be located between the second organic insulating layer OIL2 and the third organic insulating layer OIL3. In an embodiment, the second wiring WL2 may be electrically connected to the second connection electrode CM2 through a contact hole defined in the second organic insulating layer OIL2.

The display element layer DEL may be located on the pixel circuit layer PCL. In an embodiment, the display element layer DEL may include the second organic light-emitting diode OLED2 as a second display element located in the second area AR2. The second organic light-emitting diode OLED2 may be located on the third organic insulating layer OIL3.

The second display element may be provided in plural. In an embodiment, the second organic light-emitting diode OLED2 may be provided in plural. The second organic light-emitting diode OLED2 may include the second electrode 211B having the second thickness t2, the second emission layer 212B, and the counter electrode 213. In an embodiment, the second electrodes 211B of the plurality of second organic light-emitting diodes OLED2 may be spaced apart from one another.

Any one of the plurality of second display elements and another one of the plurality of second display elements may be electrically connected to each other. In an embodiment, any one the plurality of second organic light-emitting diodes OLED2 and another one of the plurality of second organic light-emitting diodes OLED2 may be electrically connected to each other. Accordingly, any one of the plurality of second organic light-emitting diodes OLED2 and another one of the plurality of second organic light-emitting diodes OLED2 may emit the same light.

The wiring may electrically connect any one of the plurality of second display elements to another one of the plurality of second display elements. In an embodiment, the wiring may electrically connect any one of the plurality of second organic light-emitting diodes OLED2 to another one of the plurality of second organic light-emitting diodes OLED2. Although the second wiring WL2 electrically connects any one of the plurality of second organic light-emitting diodes OLED2 to another one of the plurality of second organic light-emitting diodes OLED2 in FIG. 9, in another embodiment, the first wiring may electrically connect any one of the plurality of second organic light-emitting diodes OLED2 to another one of the plurality of second organic light-emitting diodes OLED2. Because the wiring includes a transparent conducting oxide, although any one of the plurality of second organic light-emitting diodes OLED2 is electrically connected to another one of the plurality of second organic light-emitting diodes OLED2, a decrease in a transmittance (e.g., a light transmittance) of the display panel 10 in the second area AR2 may be prevented or reduced.

Figure 10:
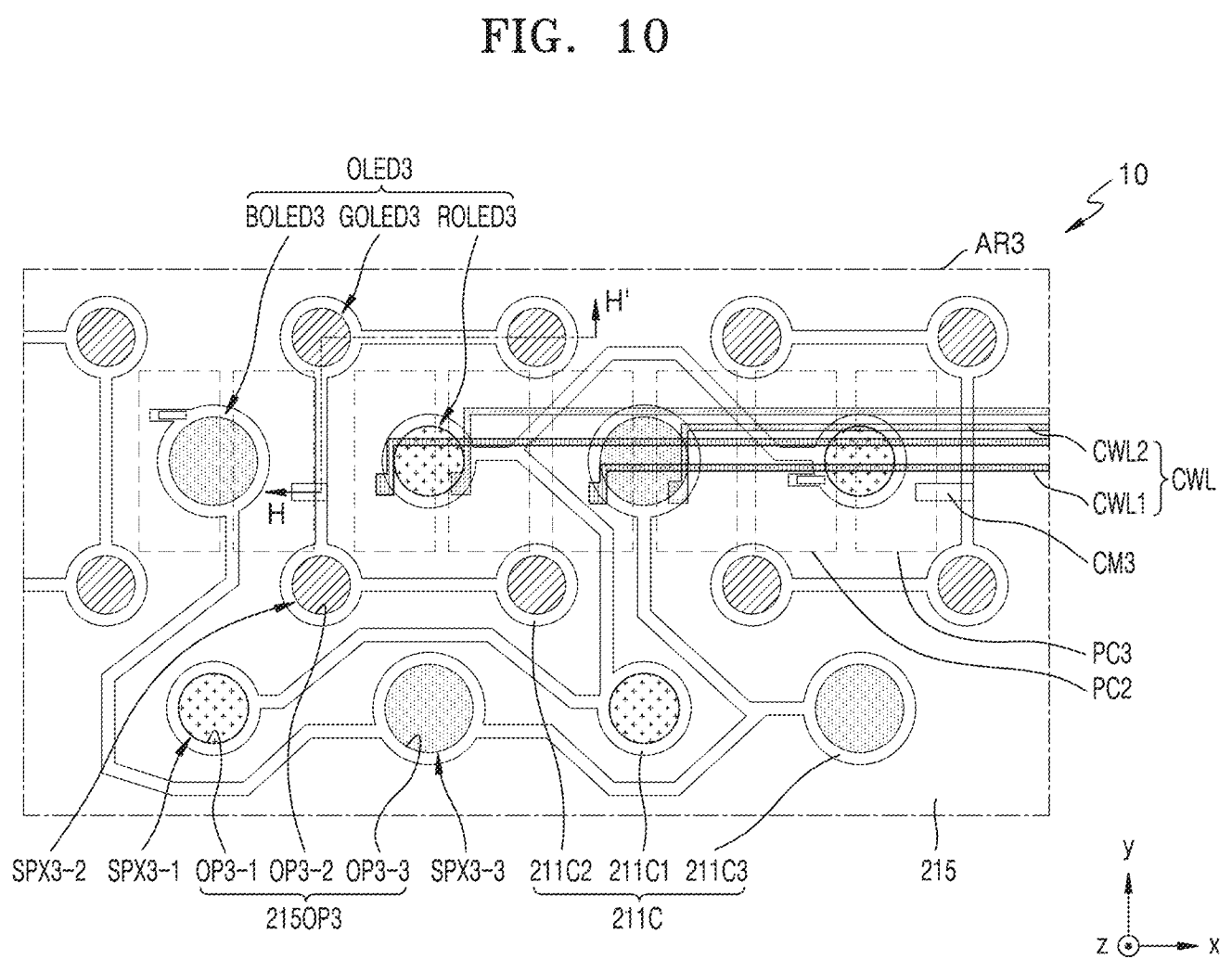

FIG. 10 is a plan view illustrating a part of the third area AR3 of the display panel 10, according to an embodiment.

Referring to FIG. 10, the display panel 10 may include the substrate 100 including the third area AR3, an organic light-emitting diode as a display element, the pixel-defining film 215, the second pixel circuit PC2, the third pixel circuit PC3, a third connection electrode CM3, and the connection wiring CWL.

The third organic light-emitting diode OLED3 as a third display element may be located in the third area AR3. The third display element may be provided in plural. In an embodiment, the third organic light-emitting diode OLED3 may be provided in plural. In an embodiment, the third organic light-emitting diode OLED3 may include a third red organic light-emitting diode ROLED3, a third green organic light-emitting diode GOLED3, and a third blue organic light-emitting diode BOLED3. In an embodiment, a plurality of third red organic light-emitting diodes ROLED3, a plurality of third green organic light-emitting diodes GOLED3, and a plurality of third blue organic light-emitting diodes BOLED3 may be provided.

The third red organic light-emitting diode ROLED3, the third green organic light-emitting diode GOLED3, and the third blue organic light-emitting diode BOLED3 may implement a third red sub-pixel SPX3-1, a third green sub-pixel SPX3-2, and a third blue sub-pixel SPX3-3, respectively. When the third organic light-emitting diode OLED3 is used as a third display element, an emission area of the third display element may be defined by a third electrode opening portion 215OP3 of the pixel-defining film 215. In an embodiment, the third red sub-pixel SPX3-1, the third green sub-pixel SPX3-2, and the third blue sub-pixel SPX3-3 may be arranged in a pentile structure.

The pixel-defining film 215 may cover an edge of a third electrode 211C, and may define a third electrode opening portion 215OP3 defining an emission area of the third organic light-emitting diode OLED3. In an embodiment, the third red organic light-emitting diode ROLED3 may include a third red sub-pixel electrode 211C1. The pixel-defining film 215 may cover an edge of the third red sub-pixel electrode 211C1, and may define a first opening portion OP3-1 defining an emission area of the third red organic light-emitting diode ROLED3. The third green organic light-emitting diode GOLED3 may include a third green sub-pixel electrode 211C2. The pixel-defining film 215 may cover an edge of the third green sub-pixel electrode 211C2, and may define a second opening portion OP3-2 defining an emission area of the third green organic light-emitting diode GOLED3. The third blue organic light-emitting diode BOLED3 may include a third blue sub-pixel electrode 211C3. The pixel-defining film 215 may cover an edge of the third blue sub-pixel electrode 211C3, and may define a third opening portion OP3-3 defining an emission area of the third blue organic light-emitting diode BOLED3.

Any one of the plurality of third display elements and another one of the plurality of third display elements may be electrically connected to each other. In an embodiment, any one of the plurality of third organic light-emitting diodes OLED3 and another one of the plurality of third organic light-emitting diodes OLED3 may be electrically connected to each other. Accordingly, one third pixel circuit PC3 may drive a plurality of third organic light-emitting diodes OLED3.

The third electrode 211C of any one of the plurality of third display elements and the third electrode 211C of another one of the plurality of third display elements may be integrally provided with each other. In an embodiment, the third electrode 211C of any one of the plurality of third organic light-emitting diodes OLED3 and the third electrode 211C of another one of the plurality of third organic light-emitting diodes OLED3 may be integrally provided with each other. Accordingly, any one of the plurality of third organic light-emitting diodes OLED3 and another one of the plurality of third organic light-emitting diodes OLED3 may be electrically connected to each other.

In an embodiment, the second pixel circuit PC2 and the third pixel circuit PC3 may be located in the third area AR3.

The third connection electrode CM3 may be electrically connected to the third pixel circuit PC3. The third connection electrode CM3 may electrically connect the third pixel circuit PC3 to the third organic light-emitting diode OLED3 which is a third display element. In some embodiments, the third connection electrode CM3 may be omitted.

The connection wiring CWL may be electrically connected to the second pixel circuit PC2. The connection wiring CWL may electrically connect the second pixel circuit PC2 to a second organic light-emitting diode which is a second display element. The connection wiring CWL may include at least one of the first connection wiring CWL1 and the second connection wiring CWL2. In an embodiment, the connection wiring CWL may include the first connection wiring CWL1 and the second connection wiring CWL2.

Figure 11:
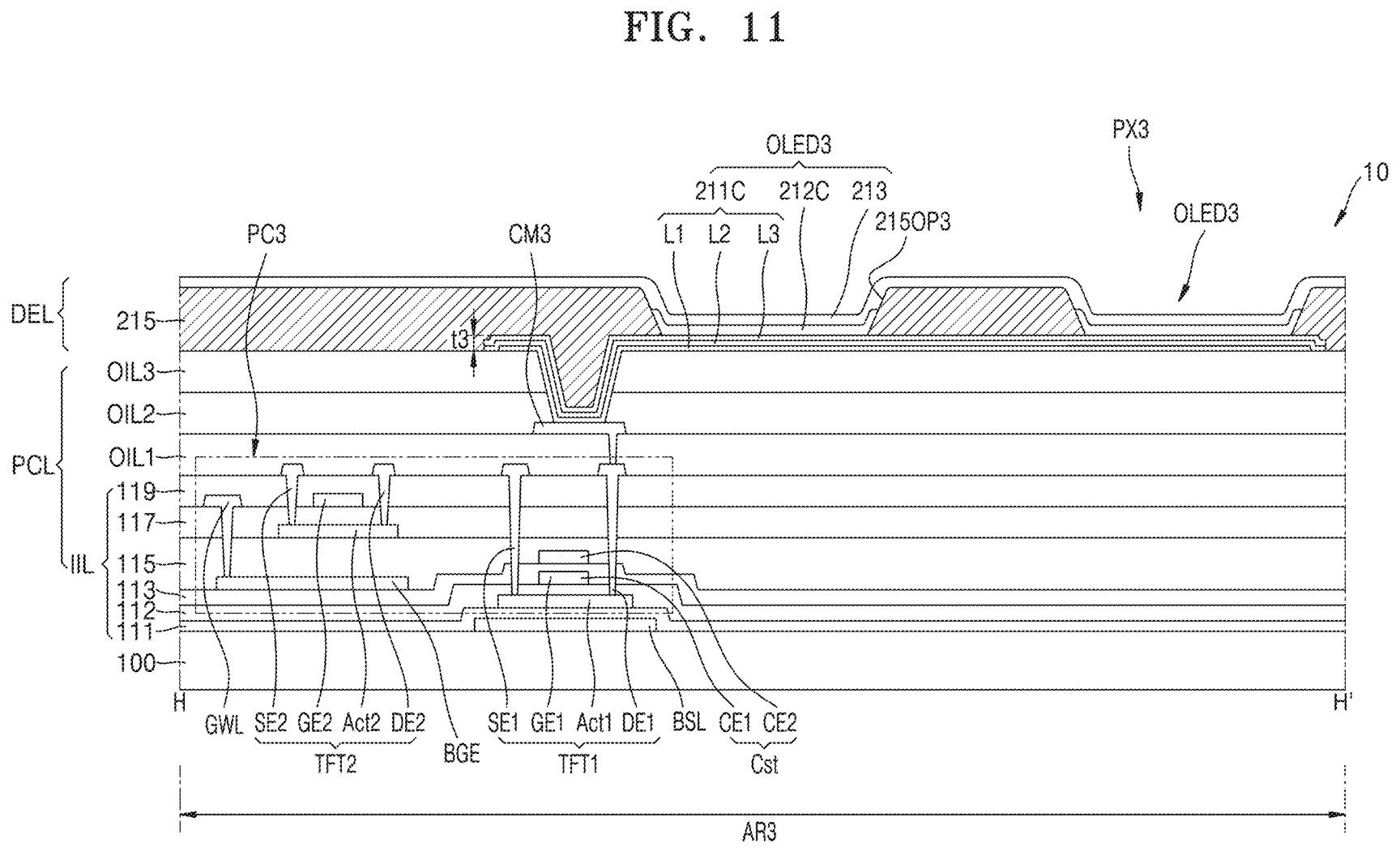

FIG. 11 is a cross-sectional view taken along line H-H' of the display panel 10 of FIG. 10. In FIG. 11, the same elements as those illustrated in FIG. 10 are denoted by the same reference numerals, and thus a repeated description thereof will be omitted.

Referring to FIG. 11, the display panel 10 may include the substrate 100 including the third area AR3, the pixel circuit layer PCL, and the display element layer DEL including the third organic light-emitting diode OLED3 as a third display element.

The pixel circuit layer PCL may be located on the substrate 100. The pixel circuit layer PCL may include the inorganic insulating layer IIL, the third pixel circuit PC3, the first organic insulating layer OIL1, the third connection electrode CM3, the second organic insulating layer OIL2, and the third organic insulating layer OIL3. The inorganic insulating layer IIL may include the buffer layer 111, the first gate insulating layer 112, the second gate insulating layer 113, the first inorganic insulating layer 115, the second inorganic insulating layer 117, and the interlayer insulating layer 119.

The third pixel circuit PC3 may be located in the third area AR3. The third pixel circuit PC3 may include the first thin-film transistor TFT1, the second thin-film transistor TFT2, and the storage capacitor Cst.

The third connection electrode CM3 may be located on the first organic insulating layer OIL1. The third connection electrode CM3 may be located between the first organic insulating layer OIL1 and the second organic insulating layer OIL2.

The display element layer DEL may be located on the pixel circuit layer PCL. In an embodiment, the display element layer DEL may include the third organic light-emitting diode OLED3 as a third display element located in the third area AR3 and the pixel-defining film 215. The third organic light-emitting diode OLED3 may be located on the third organic insulating layer OIL3.

The third organic light-emitting diode OLED3 may be electrically connected to the third pixel circuit PC3. In the third area AR3, the third organic light-emitting diode OLED3 in the third area AR3 may be electrically connected to the third pixel circuit PC3 to implement the third pixel PX3.

The third display element may be provided in plural. In an embodiment, the third organic light-emitting diode OLED3 may be provided in plural. The third organic light-emitting diode OLED3 may include the third electrode 211C, a second emission layer 212B, and the counter electrode 213.

The third electrode 211C may have a third thickness t3. The third thickness t3 may be a distance between a bottom surface of the third electrode 211C and a top surface of the third electrode 211C. For example, the bottom surface of the third electrode 211C may face the substrate 100. The top surface of the third electrode 211C which is opposite to the bottom surface of the third electrode 211C may face a third emission layer 212C. In an embodiment, the third thickness t3 may be greater than the second thickness t2 (see FIG. 8).

In an embodiment, the third electrode 211C may include a plurality of layers. In an embodiment, the third electrode 211C may include the first layer L1 and the second layer L2. In another embodiment, the third electrode 211C may include the first layer L1, the second layer L2, and the third layer L3. The second layer L2 and the third layer L3 may cover the first layer L1. In an embodiment, the second layer L2 may cover a top surface of the first layer L1 and a side surface of the first layer L1. The first layer L1 may include at least one of indium (In), tin (Sn), and oxygen (O). The second layer L2 may include a reflective film. The third layer L3 may include at least one of indium (In), tin (Sn), and oxygen (O).

Any one of the plurality of third display elements and another one of the plurality of third display elements may be electrically connected to each other. In an embodiment, any one of the plurality of third organic light-emitting diodes OLED3 and another one of the plurality of third organic light-emitting diodes OLED3 may be electrically connected to each other. Accordingly, one third pixel circuit PC3 may drive a plurality of third organic light-emitting diodes OLED3.

The third electrode 211C of any one of the plurality of third display elements and the third electrode 211C of another one of the plurality of third display elements may be integrally provided with each other. In an embodiment, the third electrode 211C of any one of the plurality of third organic light-emitting diodes and the third electrode 211C of another one of the plurality of third organic light-emitting diodes OLED3 may be integrally provided with each other. Accordingly, any one of the plurality of third organic light-emitting diodes OLED3 and another one of the plurality of third organic light-emitting diodes OLED3 may be electrically connected to each other.

The pixel-defining film 215 may define the third electrode opening portion 215OP3 through which a central portion of the third electrode 211C is exposed, and may be located on the third electrode 211C. The third electrode opening portion 215OP3 may define an emission area of light emitted by the third organic light-emitting diode OLED3.

The pixel-defining film 215 may separate the third electrode 211C from the counter electrode 213. Accordingly, the third electrode 211C of any one of the plurality of third organic light-emitting diodes OLED3 and the third electrode 211C of another one of the plurality of third organic light-emitting diodes OLED3 may be integrally provided with each other.

The third emission layer 212C may be located on the third electrode 211C. The third emission layer 212C may overlap the third electrode opening portion 215OP3 in the plan view. The third emission layer 212C may include a low molecular weight material or a high molecular weight material, and may emit red light, green light, blue light, or white light, like a first emission layer. The counter electrode 213 may be located on the third emission layer 212C.

FIGS. 12A through 12I are cross-sectional views illustrating a method of manufacturing a display apparatus, according to an embodiment. In FIGS. 12A through 12I, the same elements as those illustrated in FIG. 8 are denoted by the same reference numerals, and thus a repeated description thereof will be omitted.

Figure 12A:
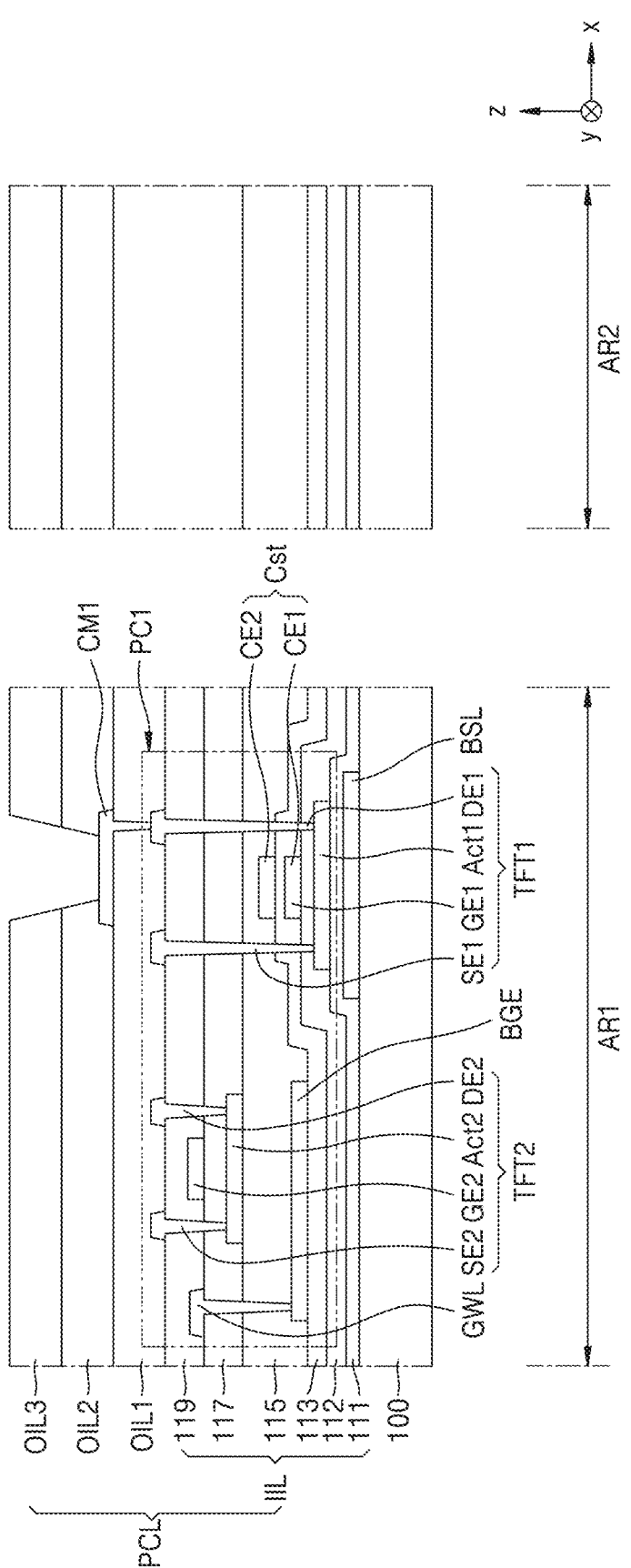

Referring to FIG. 12A, the substrate 100 may include the first area AR1 and the second area AR2. The pixel circuit layer PCL may be located on the substrate 100. In an embodiment, the pixel circuit layer PCL may include the first pixel circuit PC1, the inorganic insulating layer IIL, the first organic insulating layer OIL1, the first connection electrode CM1, the second organic insulating layer OIL2, and the third organic insulating layer OIL3. The first pixel circuit PC1 may include the first thin-film transistor TFT1, the second thin-film transistor TFT2, and the storage capacitor Cst. In an embodiment, the first connection electrode CM1 may be exposed through a contact hole defined in the second organic insulating layer OIL2 and a contact hole defined in the third organic insulating layer OIL3.

Figure 12B:
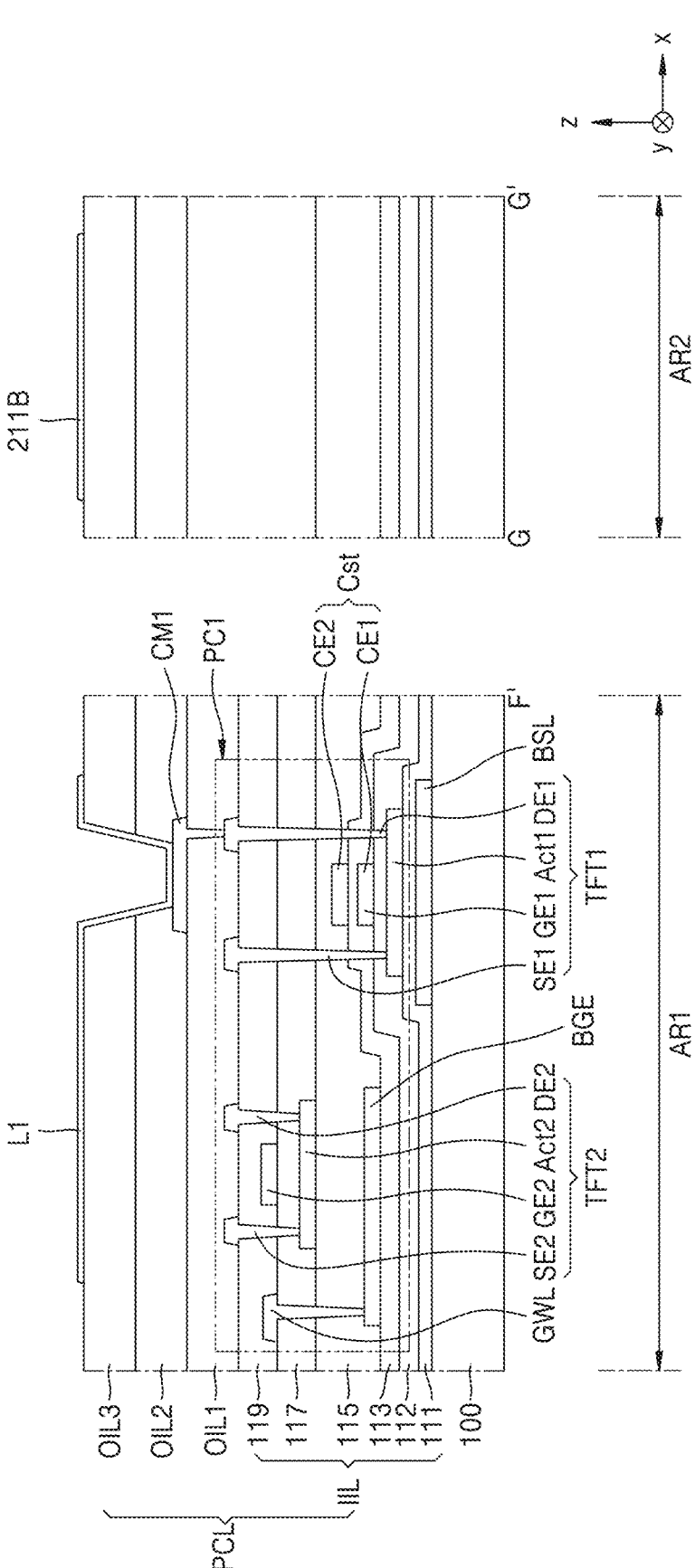

Referring to FIG. 12B, the first layer L1 may be formed in the first area AR1, and the second electrode 211B may be formed in the second area AR2. In an embodiment, the first layer L1 and the second electrode 211B may be spaced apart from each other. In an embodiment, the first layer L1 may contact the first connection electrode CM1 through the contact hole defined in the second organic insulating layer OIL2 and the contact hole defined in the third organic insulating layer OIL3.

In an embodiment, a conductive layer including a transparent conducting oxide may be entirely formed in the first area AR1 and the second area AR2. In an embodiment, the conductive layer may be formed by using sputtering. In an embodiment, the conductive layer may include at least one of In, indium (In), tin (Sn), and oxygen (O). For example, the conductive layer may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO).

Next, the conductive layer may be patterned to form the first layer L1 and the second electrode 211B. In an embodiment, the conductive layer may be wet etched and may be cured. Accordingly, the conductive layer may be crystallized to form the first layer L1 and the second electrode 211B.

Figure 12C:
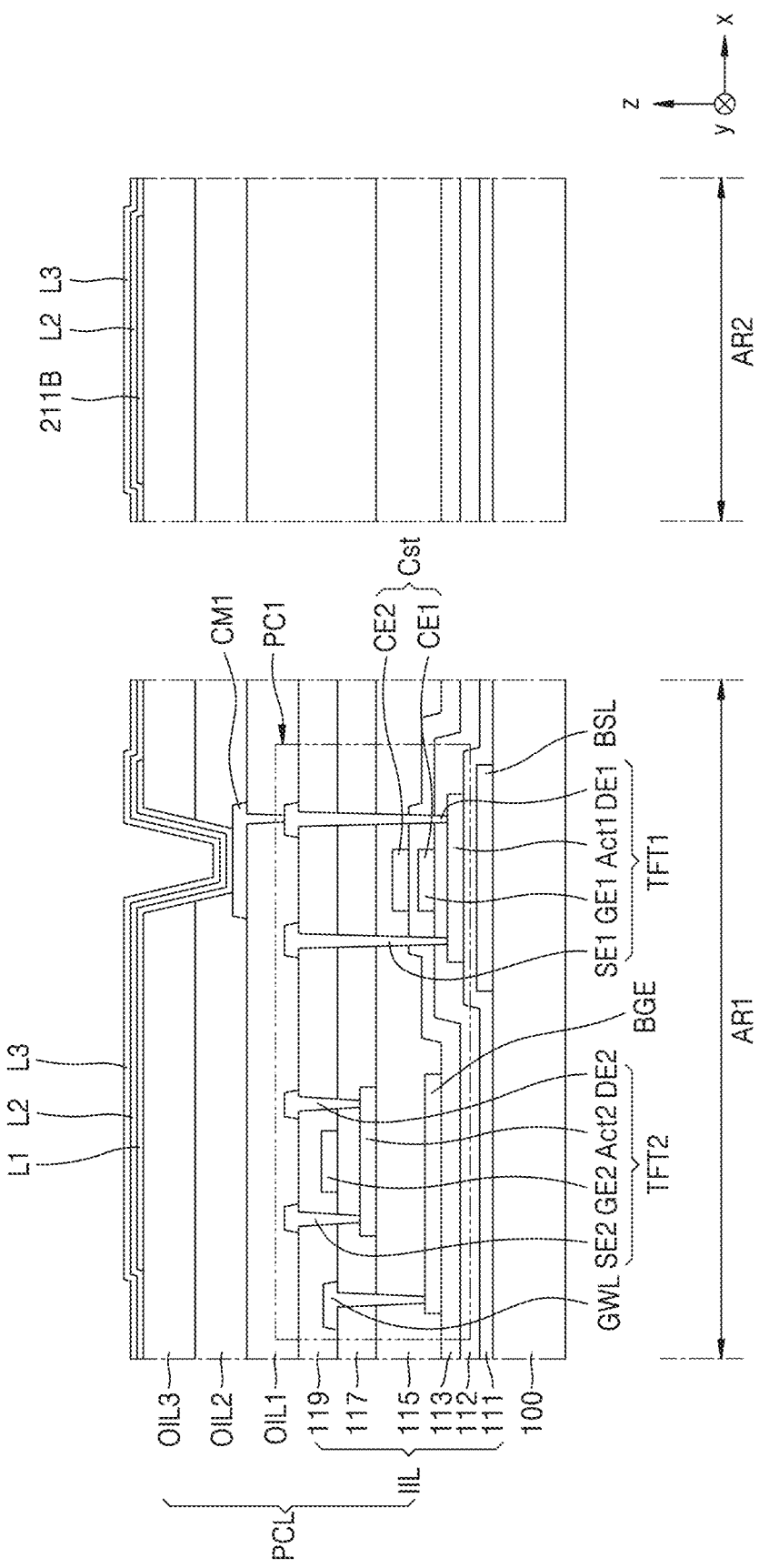

Referring to FIG. 12C, the second layer L2 and the third layer L3 may be formed. The second layer L2 and the third layer L3 may be entirely formed in the first area AR1 and the second area AR2. In an embodiment, the second layer L2 and the third layer L3 may cover the first layer L1. The second layer L2 and the third layer L3 may cover the second electrode 211B.

In an embodiment, the second layer L2 may include a reflective film. The second layer L2 may include silver (Ag), magnesium (Mg), aluminum (Al), platinum (Pt), palladium (Pd), gold (Au), nickel (Ni), neodymium (Nd), iridium (Ir), chromium (Cr), or a compound thereof.

In an embodiment, the third layer L3 may include at least one of indium (In), tin (Sn), and oxygen (O). In an embodiment, the third layer L3 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO).

Figure 12D:
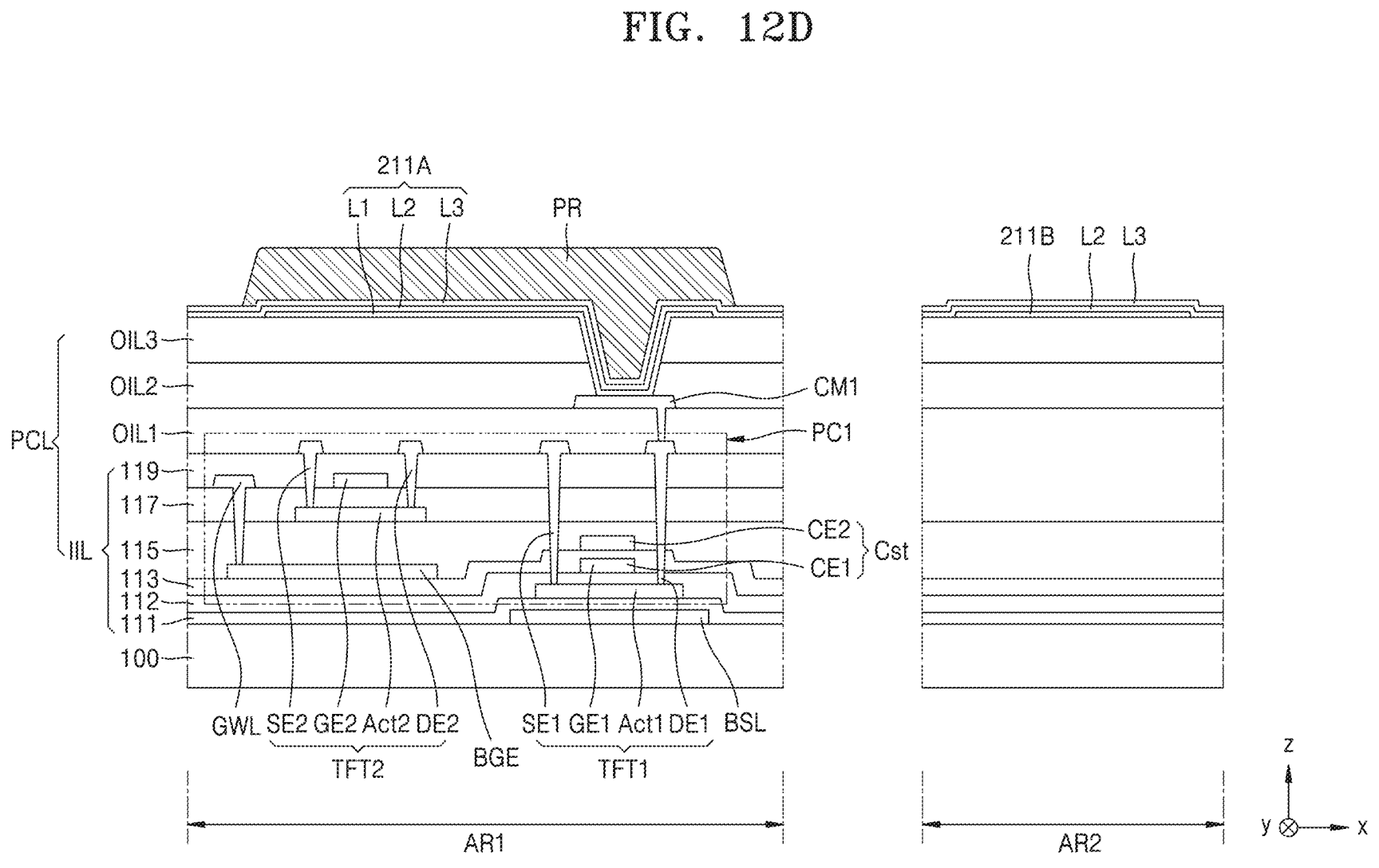

Referring to FIG. 12D, a photoresist pattern PR may be formed. The photoresist pattern PR may be formed in the first area AR1. The photoresist pattern PR may be formed on the first layer L1. In an embodiment, the photoresist pattern PR may include an organic insulating material.

Figure 12E:
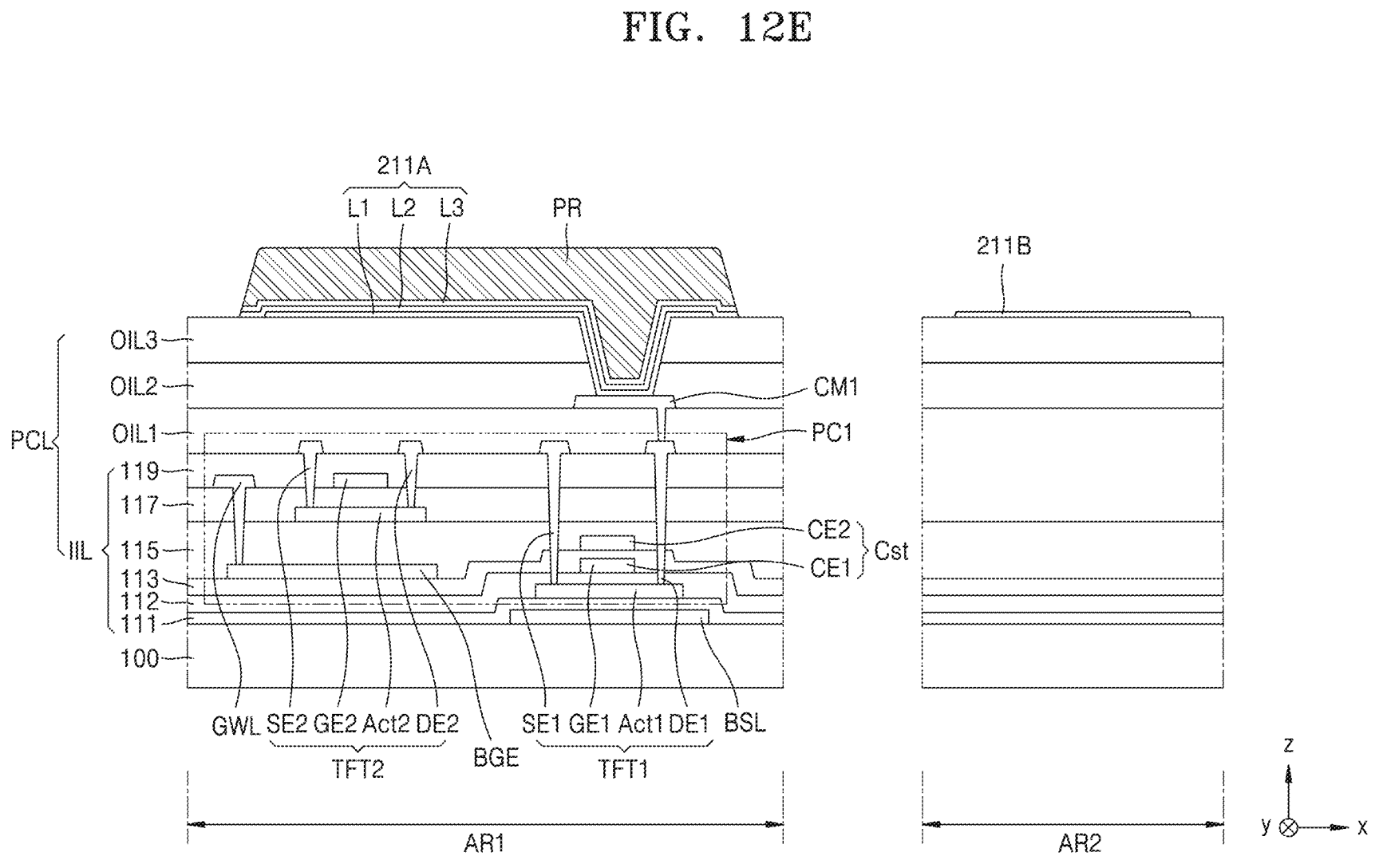

Referring to FIG. 12E, the second layer L2 and the third layer L3 may be at least partially removed. The second layer L2 and the third layer L3 not overlapping the photoresist pattern PR may be removed. In an embodiment, the second layer L2 and the third layer L3 may be wet etched. Accordingly, the second electrode 211B located in the second area AR2 may be exposed. In an embodiment, because the second electrode 211B is crystallized as described above, the second electrode 211B may not be removed when the second layer L2 and the third layer L3 are wet etched.

Because the photoresist pattern PR overlaps the first layer L1, the second layer L2, and the third layer L3 located in the first area AR1, the first layer L1, the second layer L2, and the third layer L3 may not be removed by using wet etching. In a process of at least partially wet etching the second layer L2 and the third layer L3, the photoresist pattern PR may protect the first layer L1 located in the first area AR1 so that the first layer L1 is maintained in a preset shape or size.

Figure 12F:
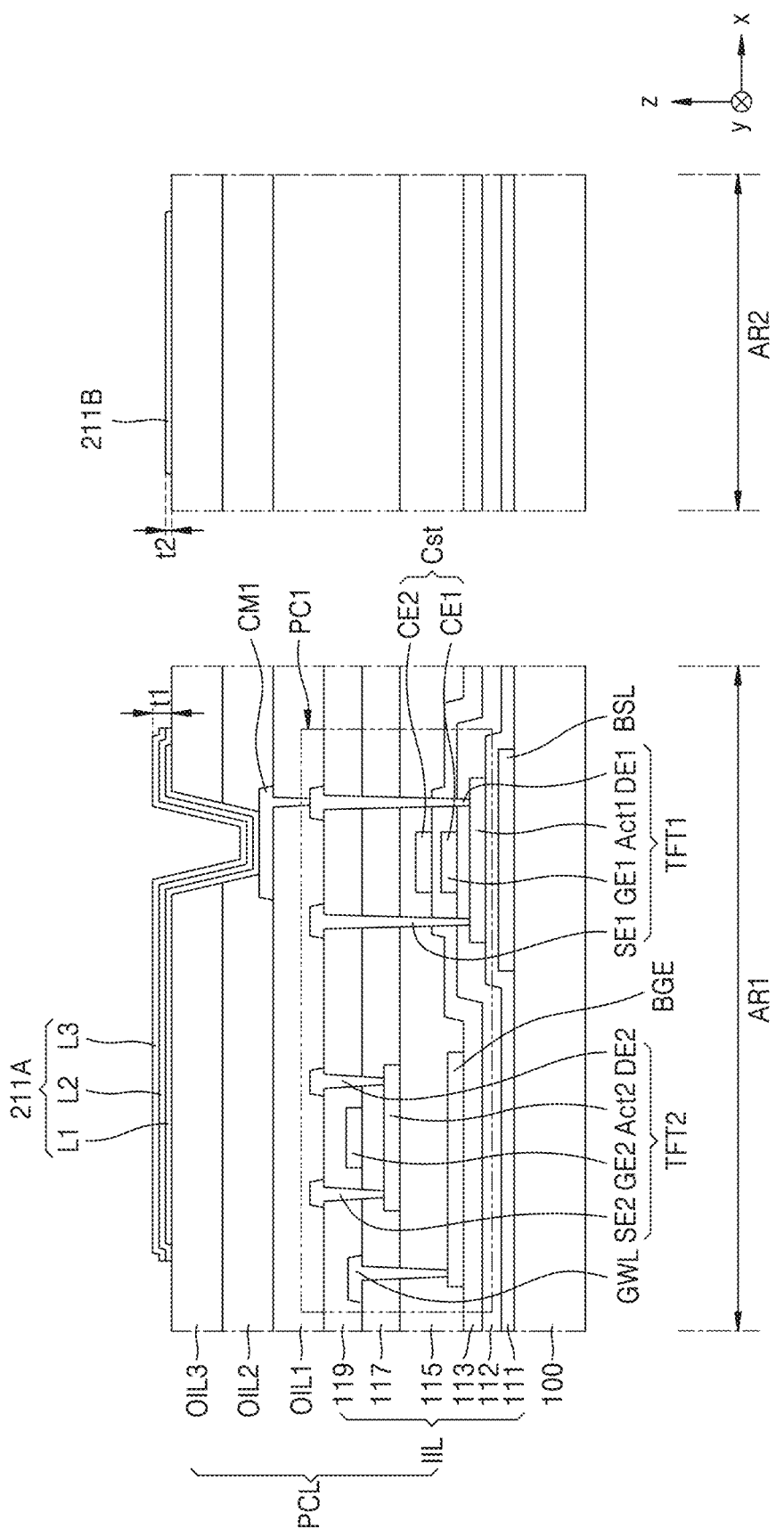

Referring to FIG. 12F, the photoresist pattern PR may be removed. The photoresist pattern PR may be removed by using a development process. Next, in an embodiment, the second layer L2 and the third layer L3 may be cured to form the first electrode 211A.

The first electrode 211A may have the first thickness t1. The second electrode 211B may have the second thickness t2. In an embodiment, the second thickness t2 may be less than the first thickness t1. In an embodiment, a difference between the second thickness t2 and the first thickness t1 may be a sum of a thickness of the second layer L2 and a thickness of the third layer L3. A transmittance (e.g., a light transmittance) of the second electrode 211B may be higher than a transmittance of the first electrode 211A.

Figure 12G:
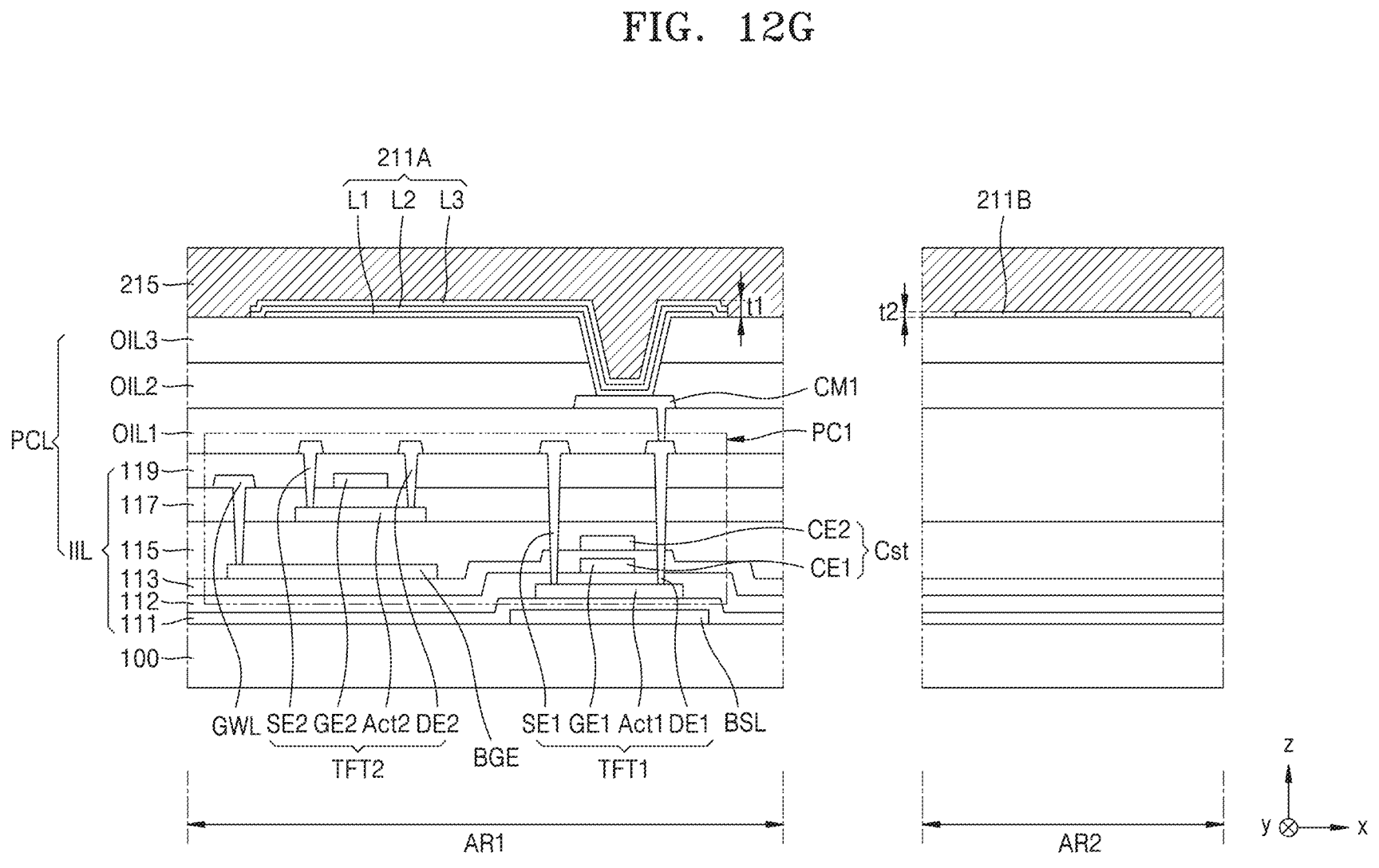

Referring to FIG. 12G, the pixel-defining film 215 may be formed. In an embodiment, the pixel-defining film 215 may be entirely formed in the first area AR1 and the second area AR2. The pixel-defining film 215 may cover the first electrode 211A and the second electrode 211B. In an embodiment, the pixel-defining film 215 may cover an edge of the first electrode 211A.

The pixel-defining film 215 may include an organic insulating material. In another embodiment, the pixel-defining film 215 may include an inorganic insulating material such as silicon nitride ($SiN_x$), silicon oxynitride (SiON), or silicon oxide ($SiO_2$). In another embodiment, the pixel-defining film 215 may include an organic insulating material and an inorganic insulating material. In some embodiments, the pixel-defining film 215 may include a light-blocking material, and may be black. The light-blocking material may include a resin or paste including carbon black, carbon nanotubes, or a black dye, metal particles such as nickel, aluminum, molybdenum, or an alloy thereof, metal oxide particles (e.g., chromium oxide), or metal nitride particles (e.g., chromium nitride). When the pixel-defining film 215 includes the light-blocking material, reflection of external light by metal structures located under the pixel-defining film 215 may be reduced.

Figure 12H:
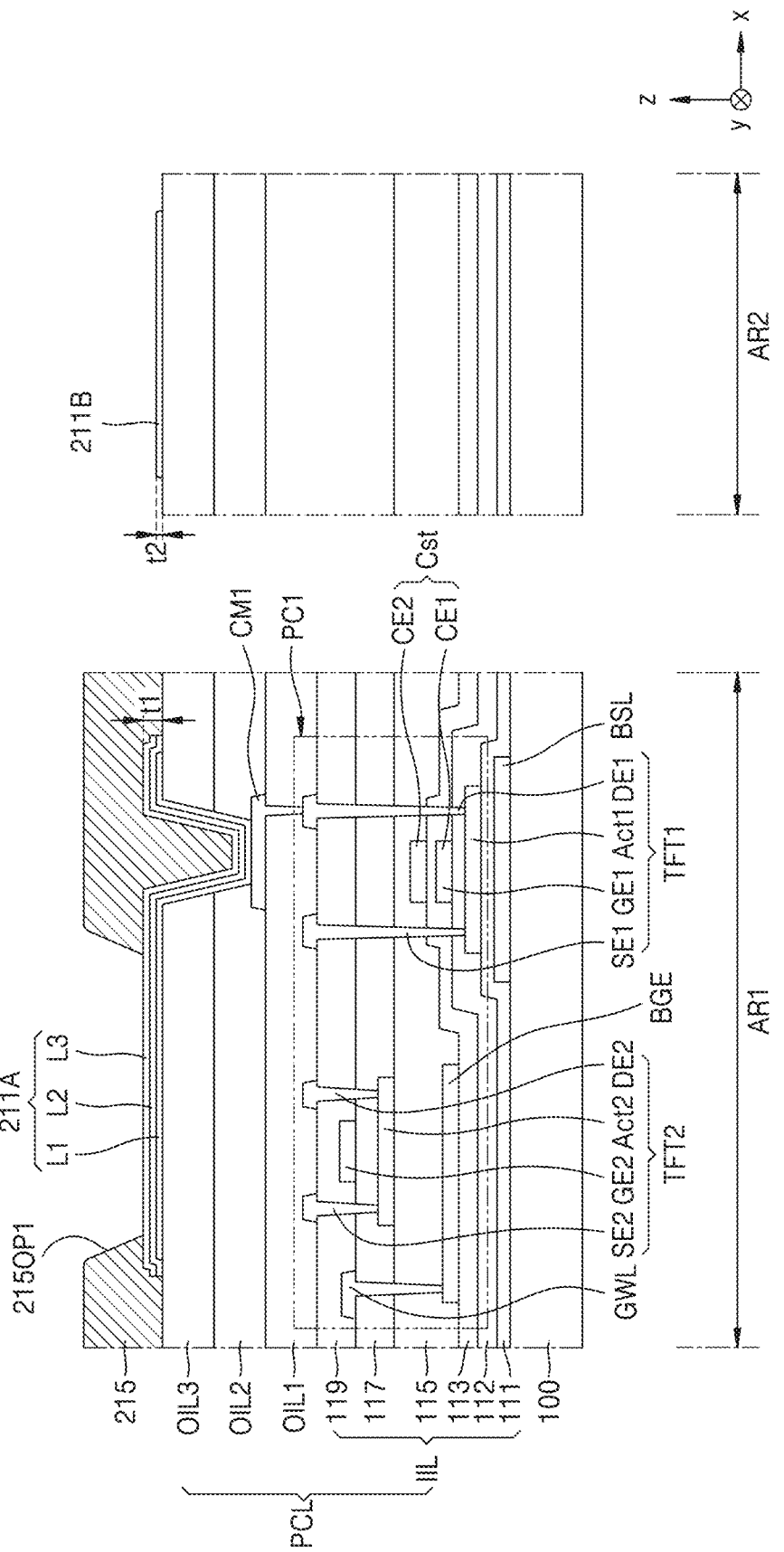

Referring to FIG. 12H, at least a part of the pixel-defining film 215 may be removed. In an embodiment, the first electrode opening portion 215OP1 overlapping the first electrode 211A may be formed in the first area AR1. The first electrode opening portion 215OP1 may expose at least a part of the first electrode 211A. Also, the pixel-defining film 215 may still cover an edge of the first electrode 211A.

The pixel-defining film 215 located in the second area AR2 may be removed. In other words, a second area opening portion of the pixel-defining film 215 overlapping the second area AR2 may be formed. Accordingly, the second electrode 211B may be exposed. In an embodiment, a top surface of the second electrode 211B and a side surface of the second electrode 211B may be exposed. In this case, a transmittance (e.g., a light transmittance) of a display apparatus and/or a display panel manufactured in the second area AR2 may increase. Also, because the second electrode 211B does not include a reflective film including silver (Ag), a side surface of the second electrode 211B may not need to be covered by the pixel-defining film 215.

Figure 12I:
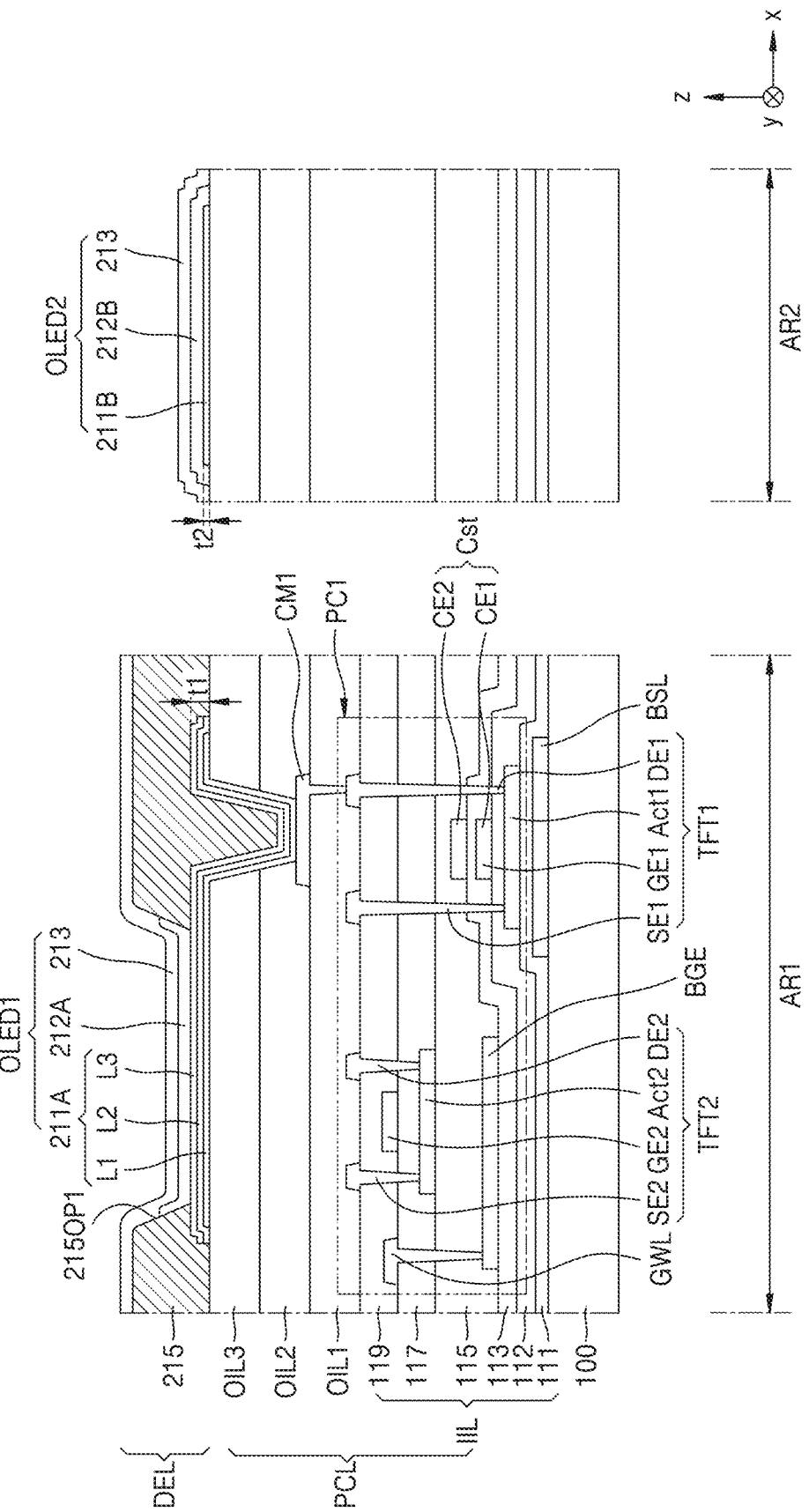

Referring to FIG. 12I, the first emission layer 212A may be formed in the first area AR1. The first emission layer 212A may overlap the first electrode opening portion 215OP1. In an embodiment, the first emission layer 212A may be formed on the first electrode 211A.

The second emission layer 212B may be formed in the second area AR2. The second emission layer 212B may be formed on the second electrode 211B. The second emission layer 212B may cover the second electrode 211B. In an embodiment, the second emission layer 212B may cover a top surface of the second electrode 211B and a side surface of the second electrode 211B.

The counter electrode 213 may be formed in the first area AR1 and the second area AR2. The counter electrode 213 may be formed on the first emission layer 212A and the second emission layer 212B. In the first area AR1, the pixel-defining film 215 and the first emission layer 212A may separate the first electrode 211A from the counter electrode 213. Accordingly, a short circuit may be prevented or reduced from occurring in the manufactured display apparatus and/or display panel. In the second area AR2, the second emission layer 212B may cover a top surface of the second electrode 211B and a side surface of the second electrode 211B. Accordingly, a short circuit may be prevented or reduced from occurring in the manufactured display apparatus and/or display panel.

The first electrode 211A, the first emission layer 212A, and the counter electrode 213 may constitute the first organic light-emitting diode OLED1. The second electrode 211B, the second emission layer 212B, and the counter electrode 213 may constitute the second organic light-emitting diode OLED2.

As described above, according to an embodiment, a second display element includes a second electrode having a thickness less than a thickness of a first electrode of a first display element, thereby increasing a transmittance of a display apparatus in a second area. Also, any one of a plurality of second display elements and another one of the plurality of second display elements may be electrically connected to each other, and the display apparatus may maintain a high transmittance in the second area.

According to an embodiment, a pixel-defining film defining a second area opening portion overlapping the second area may be provided. Accordingly, the display apparatus may maintain a high transmittance in the second area.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
   a substrate comprising a first area and a second area;
   a display element layer comprising a first display element and a second display element, wherein the first display element includes a first electrode having a first thickness and is located in the first area, and the second display element includes a second electrode having a second thickness, which is less than the first thickness, and is located in the second area; and
   a pixel-defining film covering an edge of the first electrode and defining a first electrode opening portion overlapping the first electrode, wherein the pixel-defining film is absent from the second area such that no portion of the pixel-defining film overlies the second electrode, and the pixel-defining film defines a second area opening portion overlapping an entirety of the second area in a plan view, wherein a plurality of second display elements are provided, wherein one of the plurality of second display elements and another one of the plurality of second display elements are electrically connected to each other.

2. The display apparatus of claim 1, wherein the first electrode comprises a first layer comprising at least one of indium (In), tin (Sn), and oxygen (O), and a second layer comprising the second layer comprises silver (Ag), and, the second electrode comprises at least one of indium (In), tin (Sn), and oxygen (O).

3. The display apparatus of claim 1, wherein the pixel-defining film comprises a light-blocking material.

4. The display apparatus of claim 2, wherein the first display element comprises a first emission layer overlapping the first electrode opening portion in the plan view, and the second display element comprises a second emission layer located on the second electrode and covering a side surface of the second electrode.

5. The display apparatus of claim 1, further comprising a wiring located between the substrate and the display element layer, wherein the wiring is configured to electrically connect one of the plurality of second display elements to a second one of the plurality of second display elements.

6. The display apparatus of claim 1, wherein the substrate further comprises a third area adjacent to the second area, wherein the display apparatus further comprises:

a first pixel circuit electrically connected to the first display element and located in the first area;

a second pixel circuit electrically connected to the second display element and located in the third area; and a connection wiring extending from the third area to the second area and which electrically connects the second display element to the second pixel circuit.

7. The display apparatus of claim 6, further comprising an organic insulating layer located between the substrate and the display element layer, wherein the connection wiring comprises one of a first connection wiring located between the substrate and the organic insulating layer and a second connection wiring located between the organic insulating layer and the display element layer.

8. The display device of claim 6, wherein the display element layer further comprises a third display element located in the third area and comprising a third electrode having a third thickness, wherein the third display element is provided in plural, wherein the third electrode of one of the plurality of third display elements and the third electrode of another one of the plurality of third display elements are integrally provided with each other.

9. The display apparatus of claim 1, further comprising a component overlapping the second area in a plan view.

10. A display apparatus comprising:

a substrate comprising a first area and a second area; and a display element layer which comprises a first display element, a second display element and a pixel-defining film, wherein the first display element includes a first electrode located in the first area, wherein the second display element includes a second electrode is located in the second area, wherein the pixel-defining film covers an edge of the first electrode and defines a first electrode opening portion overlapping the first electrode, wherein the pixel-defining film defines a second area opening portion overlapping an entirety of the second area in a plan view and is absent from the second area such that no portion of the pixel-defining film overlies the second electrode, wherein the pixel-defining film comprises a light-blocking material, wherein a plurality of second display elements are provided, and wherein one of the plurality of second display elements and another one of the plurality of second display elements are electrically connected to each other.

11. The display apparatus of claim 10, wherein the first electrode has a first thickness, and the second electrode has a second thickness which wherein the second thickness is less than the first thickness.

12. The display apparatus of claim 11, wherein the first electrode comprises a first layer comprising at least one of indium (In), tin (Sn), and oxygen (O) and a second layer comprising silver (Ag), and the second electrode comprises at least one of indium (In), tin (Sn), and oxygen (O).

13. The display apparatus of claim 10, wherein the first display element comprises a first emission layer overlapping the first electrode opening portion in the plan view, and the second display element comprises a second emission layer located on the second electrode and covering a side surface of the second electrode.

14. The display apparatus of claim 10, further comprising a wiring located between the substrate and the display element layer, wherein the second display element is provided in plural, wherein the wiring is configured to electrically connect one of the plurality of second display elements to another one of the plurality of second display elements.

15. The display apparatus of claim 10, wherein the substrate further comprises a third area adjacent to the second area, wherein the display apparatus further comprises:

a first pixel circuit electrically connected to the first display element and located in the first area;

a second pixel circuit electrically connected to the second display element and located in the third area; and a connection wiring extending from the third area to the second area and which electrically connects the second display element to the second pixel circuit.

16. The display apparatus of claim 15, further comprising an organic insulating layer located between the substrate and the display element layer, wherein the connection wiring comprises one of a first connection wiring located between the substrate and the organic insulating layer and a second connection wiring located between the organic insulating layer and the display element layer.

17. The display apparatus of claim 15, wherein the display element layer further comprises a third display element located in the third area and comprising a third electrode having a third thickness, wherein the third display element is provided in plural, wherein the third electrode of one of the plurality of third display elements and the third electrode of another one of the plurality of third display elements are integrally provided with each other.

18. The display apparatus of claim 10, further comprising a component overlapping the second area in the plan view.

\* \* \* \* \*